(12) United States Patent
Matsumoto et al.

(10) Patent No.: US 7,385,700 B2
(45) Date of Patent: Jun. 10, 2008

(54) MANAGEMENT SYSTEM, APPARATUS, AND METHOD, EXPOSURE APPARATUS, AND CONTROL METHOD THEREFOR

(75) Inventors: Takahiro Matsumoto, Tochigi (JP); Hideki Ina, Kanagawa (JP); Takehiko Suzuki, Saitama (JP); Koichi Sentoku, Tochigi (JP); Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 445 days.

(21) Appl. No.: 11/218,538

(22) Filed: Sep. 6, 2005

(65) Prior Publication Data

US 2006/0050274 A1    Mar. 9, 2006

Related U.S. Application Data

(62) Division of application No. 10/423,889, filed on Apr. 28, 2003, now Pat. No. 6,992,767.

(30) Foreign Application Priority Data

Apr. 30, 2002    (JP) .............................. 2002-129325

(51) Int. Cl.
*G01B 11/00* (2006.01)
*G06F 19/00* (2006.01)

(52) U.S. Cl. .................. 356/401; 356/400; 355/53; 355/55; 355/67; 700/108

(58) Field of Classification Search ........ 356/399–401; 355/53, 55, 67; 700/28, 29; 250/548, 492.2
See application file for complete search history.

(56) References Cited

U.S. PATENT DOCUMENTS

| | | | |
|---|---|---|---|
| 4,634,240 A | 1/1987 | Suzuki et al. | 350/508 |
| 4,635,373 A | 1/1987 | Miyazaki et al. | 33/180 R |
| 4,645,924 A | 2/1987 | Suzuki et al. | 250/236 |
| 4,669,883 A | 6/1987 | Ina et al. | 356/401 |
| 4,669,885 A | 6/1987 | Ina | 356/443 |

(Continued)

FOREIGN PATENT DOCUMENTS

EP    1 248 154 A1    10/2002

(Continued)

OTHER PUBLICATIONS

Korean Office Action dated May 23, 2005, issued in corresponding Korean patent application No. 10-2003-0027396, with English translation.

(Continued)

*Primary Examiner*—Layla G. Lauchman
(74) *Attorney, Agent, or Firm*—Fitzpatrick, Cella, Harper & Scinto

(57) ABSTRACT

An exposure apparatus performs AGA measurement by using a predetermined sample shot group formed on a wafer, and decides an alignment parameter. The exposure apparatus executes wafer alignment processing and exposure processing by using the alignment parameter. The exposure apparatus notifies a central processing unit of AGA measurement results and the alignment parameter. An overlay inspection apparatus measures an actual exposure position on the exposed wafer, and notifies the central processing unit of the measurement result. The central processing unit optimizes alignment processing on the basis of the AGA measurement results, alignment parameter, and actually measured exposure position.

20 Claims, 18 Drawing Sheets

U.S. PATENT DOCUMENTS

| | | | |
|---|---|---|---|
| 4,780,617 A | 10/1988 | Umatate et al. | 250/548 |
| 4,834,540 A | 5/1989 | Totsuka et al. | 356/401 |
| 4,861,162 A | 8/1989 | Ina | 356/401 |
| 4,886,974 A | 12/1989 | Ina | 250/561 |
| 4,901,109 A | 2/1990 | Mitome et al. | 355/68 |
| 4,958,160 A | 9/1990 | Ito et al. | 355/53 |
| 5,243,377 A | 9/1993 | Umatate et al. | 355/53 |
| 5,249,016 A | 9/1993 | Tanaka | 355/53 |
| 5,525,808 A | 6/1996 | Irie et al. | 250/548 |
| 5,586,059 A | 12/1996 | Oshelski et al. | 364/552 |
| 5,659,384 A | 8/1997 | Ina | 355/53 |
| 5,682,239 A | 10/1997 | Matsumoto et al. | 356/349 |
| 5,742,406 A | 4/1998 | Suzuki | 356/468 |
| 5,805,866 A | 9/1998 | Magome et al. | 395/500 |
| 5,847,974 A | 12/1998 | Mori et al. | 364/571.02 |
| 5,937,069 A | 8/1999 | Nagai et al. | 380/49 |
| 5,993,043 A | 11/1999 | Fujii | 364/468.28 |
| 6,124,922 A | 9/2000 | Sentoku | 355/53 |
| 6,151,120 A | 11/2000 | Matsumoto et al. | 356/399 |
| 6,154,281 A | 11/2000 | Sentoku et al. | 356/401 |
| 6,198,181 B1 | 3/2001 | Ali et al. | 310/42 |
| 6,223,133 B1 | 4/2001 | Brown | 702/85 |
| 6,275,988 B1 | 8/2001 | Nagashima et al. | 725/8 |
| 6,311,096 B1 | 10/2001 | Saxena et al. | 700/121 |
| 6,333,786 B1 | 12/2001 | Uzawa et al. | 356/401 |
| 6,338,971 B1 | 1/2002 | Yasuda et al. | 438/14 |
| 6,344,892 B1 | 2/2002 | Sugita et al. | 355/53 |
| 6,470,230 B1 | 10/2002 | Toprac et al. | 700/121 |
| 6,493,065 B2 | 12/2002 | Ina et al. | 355/53 |
| 6,559,924 B2 | 5/2003 | Ina et al. | 355/53 |
| 6,563,573 B1 | 5/2003 | Morohoshi et al. | 356/124 |
| 6,607,926 B1 | 8/2003 | Toprac et al. | 438/7 |
| 6,639,677 B1 | 10/2003 | Ina et al. | 356/401 |
| 6,785,583 B2 | 8/2004 | Oishi et al. | 700/108 |
| 2001/0020946 A1 | 9/2001 | Kawakami et al. | 345/582 |
| 2001/0043326 A1 | 11/2001 | Ina et al. | 356/237.4 |
| 2002/0014601 A1 | 2/2002 | Yoshida | 250/548 |
| 2002/0046140 A1 | 4/2002 | Kano et al. | 705/27 |
| 2002/0051125 A1 | 5/2002 | Suzuki | 355/53 |
| 2002/0100013 A1 | 7/2002 | Miwa et al. | 716/21 |
| 2002/0111038 A1 | 8/2002 | Matsumoto et al. | 438/763 |
| 2002/0175300 A1 | 11/2002 | Suzuki et al. | 250/548 |
| 2002/0176096 A1 | 11/2002 | Sentoku et al. | 356/620 |
| 2002/0180983 A1 | 12/2002 | Ina et al. | 356/511 |
| 2003/0012373 A1 | 1/2003 | Ogura et al. | 380/30 |
| 2003/0022396 A1 | 1/2003 | Ogawa | 438/7 |
| 2003/0071980 A1 | 4/2003 | Ina et al. | 355/53 |
| 2003/0119216 A1 | 6/2003 | Weed | 438/14 |
| 2003/0121022 A1 | 6/2003 | Yoshitake et al. | 716/21 |
| 2003/0204282 A1 | 10/2003 | Oishi et al. | 700/108 |
| 2003/0204348 A1 | 10/2003 | Suzuki et al. | 702/83 |
| 2003/0204488 A1 | 10/2003 | Sentoku et al. | 707/1 |
| 2005/0137837 A1 | 6/2005 | Oishi et al. | 703/1 |

FOREIGN PATENT DOCUMENTS

| | | |
|---|---|---|
| JP | 3-185807 | 8/1991 |
| JP | 4-324615 | 11/1992 |
| JP | 5-335212 | 12/1993 |
| JP | 10-163286 | 6/1998 |
| JP | 2000-81712 | 3/2000 |
| JP | 2000-173921 | 6/2000 |
| JP | 2000-306815 | 11/2000 |
| JP | 2001-093807 | 4/2001 |
| JP | 2001-244187 | 9/2001 |
| JP | 2001-267232 | 9/2001 |
| JP | 2001-274068 | 10/2001 |
| JP | 2001-319452 | 11/2001 |
| JP | 2002-301868 | 10/2002 |
| KR | 2003-0032871 | 4/2003 |

OTHER PUBLICATIONS

European Search Report dated Jul. 4, 2005, issued in corresponding European patent application No. EP 03 00 9611, forwarded in a Communication dated Jul. 22, 2005.

Lee, C., et al., "Reducing CD Variation via Statistically Matching Steppers," *SPIE*, vol. 1261, *Integrated Circuit Metrology, Inspection and Process Control IV*, (Mar. 1990). pp. 63-70.

van den Brink, M.A., et al., "Matching Management of Multiple Wafer Steppers Using a Stable Standard and a Matching Simulator," *SPIE*, vol. 1087, *Integrated Circuit Metrology, Inspection, and Process Control III* (Feb. 1989). pp. 218-232.

Japanese Office Action dated May 11, 2007, issued in corresponding Japanese patent application No. 2002-129324.

Japanese Office Action dated May 18, 2007, issued in corresponding Japanese patent application No. 2002-129325.

Japanese Office Action dated Feb. 19, 2007, issued in corresponding Japanese patent application No. 2002-129325, with English translation.

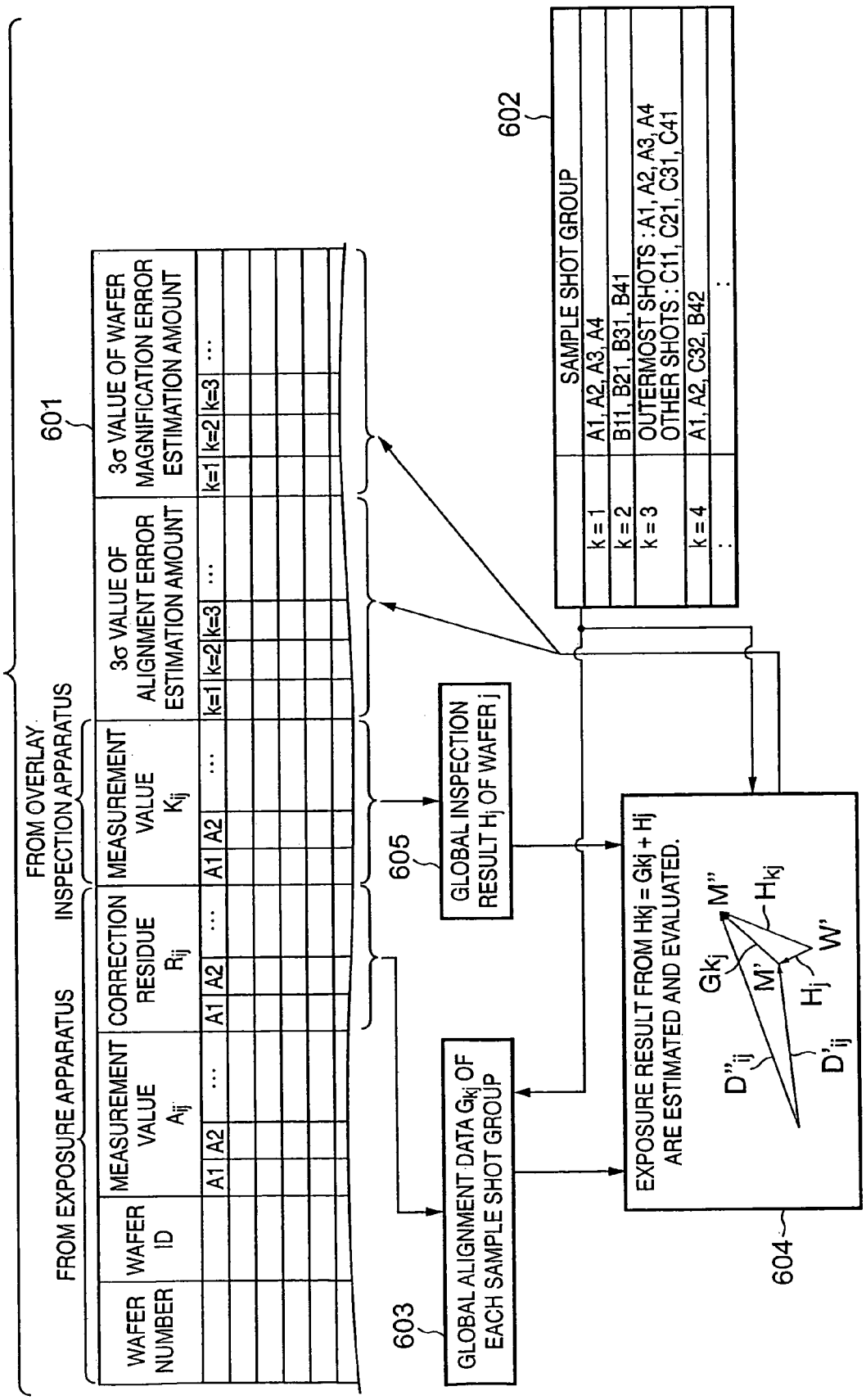

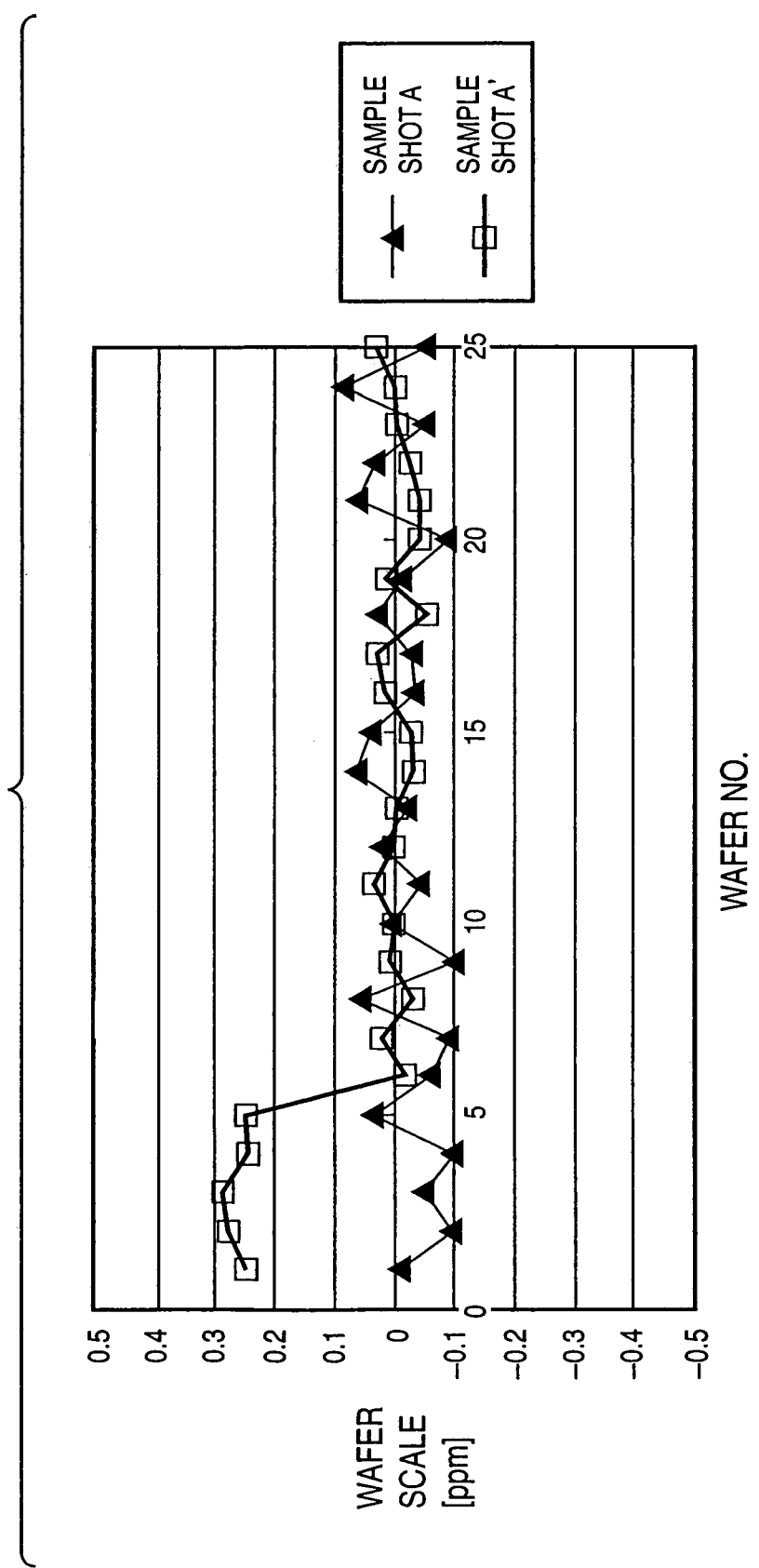

MANAGEMENT SYSTEM, APPARATUS, AND METHOD, EXPOSURE APPARATUS, AND CONTROL METHOD THEREFOR

This application is a divisional application of U.S. patent application Ser. No. 10/423,889, filed Apr. 28, 2003 now U.S. Pat. No. 6,992,767.

FIELD OF THE INVENTION

The present invention relates to a management system and a management method for managing an exposure apparatus, particularly, to an exposure apparatus, which is applied to the management system, and, more particularly, to effective alignment in a semiconductor exposure apparatus.

BACKGROUND OF THE INVENTION

Circuit micropatterning and an increase in density require a projection exposure apparatus for manufacturing a semiconductor device to project a circuit pattern formed on a reticle surface onto a wafer surface at a higher resolving power. The circuit pattern projection resolving power depends on the NA (Numerical Aperture) of a projection optical system and the exposure wavelength. The resolving power is increased by increasing the NA of the projection optical system or shortening the exposure wavelength. As for the latter method, the exposure light source is shifting from g-line to i-line, and further from i-line to an excimer laser. With the excimer laser, exposure apparatuses having oscillation wavelengths of 248 nm and 193 nm are available.

At present, a VUV (Vacuum Ultra Violet) exposure system with a shorter oscillation wavelength of 157 nm and an EUV (Extreme Ultra Violet) exposure system with a wavelength of 13 nm are examined as candidates for next-generation exposure systems.

Along with circuit micropatterning, demands have also arisen for aligning at a high precision a reticle on which a circuit pattern is formed and a wafer onto which the circuit pattern is projected. The necessary precision is one-third the circuit line width. For example, the necessary precision in a current 180-nm design is one-third, i.e., 60 nm.

In this situation, the exposure pattern overlay precision must be increased, and an increase in alignment precision is indispensable. The alignment method includes die-by-die alignment and global alignment. In die-by-die alignment, misalignment of an alignment mark is measured for each chip or shot. The misalignment is reduced to an allowance, and then exposure is executed. In global alignment, not all shots on a wafer are measured, but misalignment of several shots is measured, and a shot layout error on the wafer from the wafer stage coordinate system of an exposure apparatus is calculated. After that, the wafer is positioned at the precision of the wafer stage in accordance with the calculation result, and exposure is executed. Of these alignment methods, die-by-die alignment requires a large number of measurement operations, which is disadvantageous to throughput. Hence, global alignment advantageous to throughput is generally employed.

Various device structures have been proposed and examined for commercial use. With the spread of personal computers, and the like, micropatterning has shifted from memories such as a DRAM to CPU chips. For further IT revolution, micropatterning will be further advanced by the development of MMIC (Millimeter-wave Monolithic Integrated Circuits), and the like, used in communication system devices called a home wireless LAN and Bluetooth®, highway traffic systems (ITS: Intelligent Transport Systems) represented by a car radar using a frequency of 77 GHz, and wireless access systems (LMDS: Local Multipoint Distribution Service) using a frequency of 24 to 38 GHz.

There are also proposed various semiconductor device manufacturing processes. As a planarization technique which solves an insufficient depth of exposure apparatus, the W-CMP (Tungsten Chemical Mechanical Polishing) process has already been used. Instead, the Cu dual damascene process has received a great deal of attention.

Various semiconductor device structures and materials are used. For example, there are proposed a P-HEMT (Pseudomorphic High Electron Mobility Transistor) and M-HEMT (Metamorphe-HEMT), which are formed by combining compounds such as GaAs and InP, and an HBT (Heterojunction Bipolar Transistor) using SiGe, SiGeC, and the like.

Under the present circumstance of the semiconductor industry, many apparatus variables (=parameters) must be set in correspondence with each exposure method and each product in the use of a semiconductor manufacturing apparatus, such as an exposure apparatus. The number of parameters to be optimized is very large, and these parameters are not independent of each other, but are closely related to each other.

These parameter values have conventionally been decided by trial and error by the person in charge of introducing an apparatus of a device manufacturer. A long time is taken to decide optimal parameter values. If, e.g., a process error occurs after the parameter values are decided, the parameter values of the manufacturing apparatus must be changed again along with a corresponding change in the manufacturing process. Also, in this case, a long time is taken to set parameter values.

In the semiconductor device production, the time which can be taken until the start of volume production after the activation of a manufacturing apparatus is limited. The time which can be taken to decide a parameter value is also limited. In terms of CoO (Cost of Ownership), the operating time of the manufacturing apparatus must be prolonged. To change a parameter value which has already been decided, it must be quickly changed.

In this situation, it is very difficult to optimize parameter values for various semiconductor devices in a short time and manufacture various semiconductor devices with optimal parameter values. Even a manufacturing apparatus which can originally achieve a high yield can only exhibit a low yield because the apparatus is used without optimizing parameter values, resulting in a potential decrease in yield. Such a decrease in yield leads to a high manufacturing cost, a small shipping amount, and weak competitiveness.

Especially, in global alignment, which is generally adopted as the alignment method described above, only several shots (to be referred to as sample shots) on a wafer are measured. Measurement is greatly influenced by the stability of the alignment mark manufacturing process of the shots (for each wafer or each lot). The yield may decrease due to a low overlay precision depending on the lot. This disadvantage will become more conspicuous along with an increase in wafer diameter.

SUMMARY OF THE INVENTION

The present invention has been made to overcome the conventional drawbacks, and has as its object to optimize, during volume production, a specific parameter value used in global alignment of an exposure apparatus.

It is another object of the present invention to optimally control the alignment offset amount even when the alignment mark of a sample shot used for global alignment is abnormal and an alternative shot is used.

It is still another object of the present invention to allow selecting an optimal sample shot from all shots on a wafer.

According to the present invention, the foregoing object is attained by providing a management system which manages alignment processing of an exposure apparatus, the management system comprising:

measurement means for measuring a position of a mark position on a photosensitive substrate;

exposure processing means for calculating an alignment parameter on the basis of a measurement result of the measurement means, executing alignment processing by using the calculated alignment parameter, and exposing the photosensitive substrate;

an inspection apparatus which measures an exposure position on the photosensitive substrate exposed by the exposure processing means; and optimization means for optimizing the alignment processing on the basis of the exposure position acquired by the inspection apparatus.

According to another aspect of the present invention, the foregoing object is attained by providing a management method of managing alignment processing of an exposure apparatus, the management method comprising:

a measurement step of measuring a position of a mark on a photosensitive substrate;

an exposure processing step of calculating an alignment parameter on the basis of a measurement result in the measurement step, executing alignment processing by using the calculated alignment parameter, and exposing the photosensitive substrate;

an inspection step of inspecting an exposure result in the exposure processing step; and an optimization step of optimizing the alignment processing on the basis of an exposure position acquired in the inspection step.

In still another aspect of the present invention, the foregoing object is attained by providing a management apparatus which manages alignment processing of an exposure apparatus, the management apparatus comprising:

first acquisition means for acquiring a measurement result of a position of a mark on a photosensitive substrate by the exposure apparatus;

second acquisition means for acquiring an actual exposure position by an inspection apparatus which inspects an exposure result by the exposure apparatus; and optimization means for optimizing the alignment processing in the exposure apparatus on the basis of the measurement result acquired by the first acquisition means and the exposure position acquired by the second acquisition means.

In still another aspect of the present invention, the foregoing object is attained by providing a management method of managing alignment processing of an exposure apparatus, the management method comprising:

a first acquisition step of acquiring a measurement result of a position of a mark on a photosensitive substrate by the exposure apparatus;

a second acquisition step of acquiring an actual exposure position by an inspection apparatus which inspects an exposure result by the exposure apparatus; and an optimization step of optimizing the alignment processing in the exposure apparatus on the basis of the measurement result acquired in the first acquisition step and the exposure position acquired in the second acquisition step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10C is a view for explaining alignment offset optimization processing according to the second embodiment;

FIG. 11 is a graph for explaining optimization of a sample shot group according to the second embodiment;

DETAILED DESCRIPTION OF THE PREFERRED EMBODIMENTS

Preferred embodiments of the present invention will now be described in detail in accordance with the accompanying drawings.

First Embodiment

A management system according to the first embodiment will be described. Note that OAP (Optimization for Alignment Parameter in volume production) to be described below is adopted in the second embodiment, is not particularly necessary in the first embodiment, but will be explained for descriptive convenience.

An alignment variable optimization system, which is implemented by an exposure management system according to the first embodiment, is applied to the alignment system of an exposure apparatus, and corresponds to a volume production apparatus, will be called OAP (Optimization for Alignment Parameter in volume production). Parameter values in this specification include parameters which represent numerical values, and setting parameters representing selected values, and setting parameters representing selected states such as selection of the sample shot layout and alignment method which are not numerical values. In addition to numerical values, variables also include apparatus variation elements such as a choice and general conditions which are not numerical values.

Figure 1:
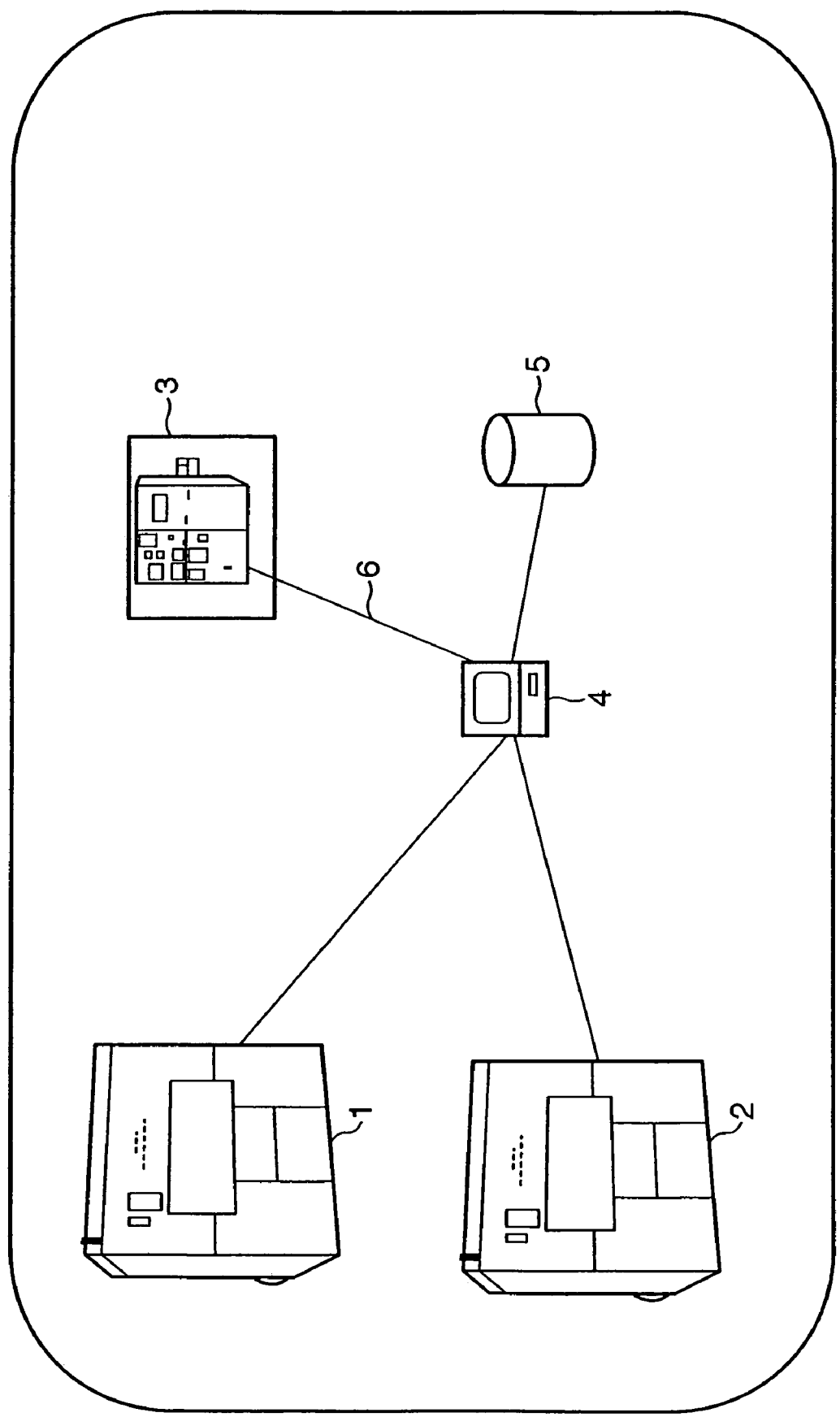
FIG. 1 is a view showing the schematic arrangement of a management system for a semiconductor exposure apparatus according to the first embodiment.

FIG. 1 is a view showing the schematic arrangement of an overall exposure management system according to the first embodiment. The exposure management system of the first embodiment includes a plurality of exposure apparatuses (in FIG. 1, exposure apparatuses 1 and 2), an overlay inspection apparatus 3, a central processing unit 4, and a database 5, which are connected by a LAN 6 (e.g., an in-house LAN). The central processing unit 4 collects various measurement values, and the like, from the semiconductor exposure apparatuses 1 and 2 and the overlay inspection apparatus 3, and saves them in the database 5. While the semiconductor exposure apparatuses 1 and 2 operate in volume production, the central processing unit 4 optimizes parameter values, and notifies the semiconductor exposure apparatuses 1 and 2 of them.

Figure 2:
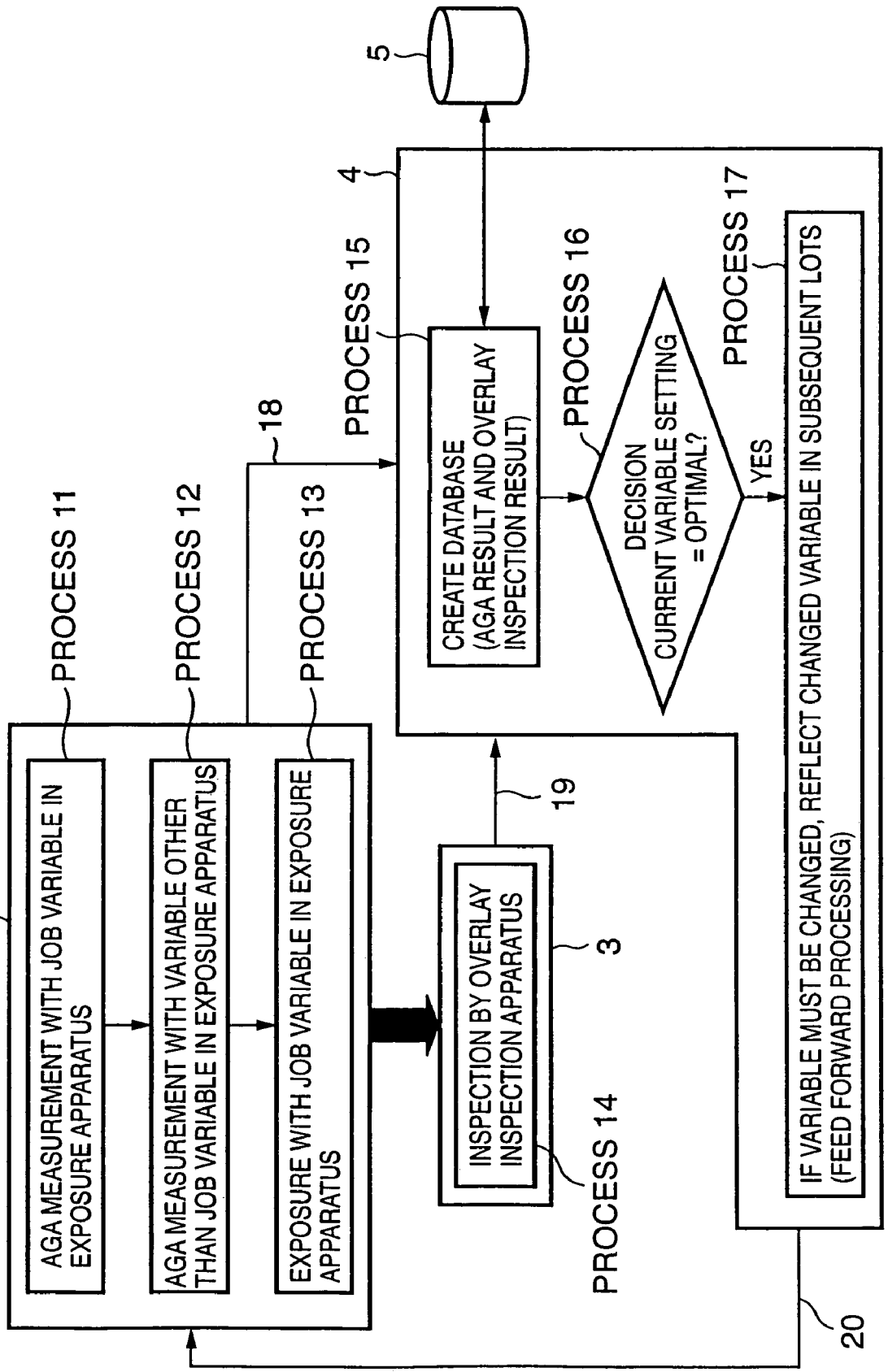
FIG. 2 is a flow chart showing a flow of the management system for the semiconductor exposure apparatus according to the first embodiment.

FIG. 2 is a flow chart showing the rough flow of OAP processing, which is realized by the exposure management system according to the first embodiment.

Assume that a wafer to be exposed is loaded into the exposure apparatus 1, and a corresponding reticle is set in the exposure apparatus (not shown in FIG. 2). After the wafer and reticle are set, global alignment called AGA (Advanced Global Alignment) is executed with a variable value (=parameter value) set for an exposure job (job concerning exposure). In AGA, a sample shot is observed to measure a wafer position at the precision of an X-Y stage equipped with a laser interferometer. Alignment measurement data (the misalignment amount of each shot and the misalignment amount of a wafer: a wafer magnification, rotation, shift, and the like) at this time are stored in the exposure apparatus (process 11). Data which are measured AGA are transferred to the central processing unit 4 which controls OAP (data transfer 18).

AGA measurement is also performed with a variable value other than the job variable value by the second stage correction driving based on stage driving information, obtaining alignment measurement data (process 12). The measurement data obtained in this process are also transferred as values to the central processing unit 4, which controls OAP, similar to the data obtained at the variable value set for the previous job (data transfer 18).

After all data are obtained in processes 11 and 12, the stage position is controlled on the basis of the AGA result with the parameter value set for the job, and the wafer is exposed (process 13).

The wafer exposed by the exposure apparatus is developed in a subsequent process. The developed wafer is supplied to the overlay inspection apparatus 3 in which the alignment result, i.e., pattern misalignment is measured (process 14). The measurement value obtained by the overlay inspection apparatus 3 is also transferred to the central processing unit 4 (data transfer 19).

The central processing unit 4, which controls OAP, stores in the database 5 the received AGA measurement results transferred from the exposure apparatus (process 15). The inspection result by the overlay inspection apparatus 3 is also transferred by data transfer 19 to the central processing unit 4, which controls OAP (data transfer 19). The inspection result is stored in the database in a form (to be described later), as shown in FIG. 7C, in correspondence with the AGA measurement values by the exposure apparatus that have already been stored in the database (process 15).

The correlation between the AGA measurement value and the measurement result from the overlay inspection apparatus 3 is checked for a designed wafer. Whether the parameter value (in this case, parameter value used for AGA) set for the current job is optimal is decided (process 16). More specifically, a predetermined evaluation value (e.g., a shift amount or a rotation amount) is compared with an evaluation value with the currently set parameter value to obtain a difference between two evaluation values. Then, whether a parameter value, which provides a desirable evaluation value having the difference larger than a given threshold exists, is decided. Note that the threshold is obtained by the empirical rule, or the like, in advance, and set in the central processing unit 4, which controls OAP. If a parameter which provides a desirable evaluation value exists, its optimal parameter value is reflected in the exposure apparatuses 1 and 2, and used as a new job setting parameter value so as to apply the optimal parameter value to a lot exposure of subsequent lots (process 17 and data transfer 20). If a parameter value whose evaluation value is better than that obtained with the currently set parameter value, but the difference between these evaluation values does not exceed the threshold, no set parameter value is changed. This is because the difference between these evaluation values falls within the error range, or the effect of changing a parameter value is weak, but a change in parameter value may have an adverse effect (e.g., a decrease in throughput due to the setting change time or degradation of another exposure condition).

By repeating the above processing, the parameter value is optimized and can be used for subsequent lots even upon process variations.

The use of the OAP system can eliminate any examination using a special wafer in a volume production site in order to set a parameter value, in addition to volume production. In other words, the alignment variable can be optimized during volume production, and the effective performance of the exposure apparatus can be improved without decreasing the productivity.

The above-described OAP system can be briefly expressed as follows. OAP in this embodiment is a feed forward system. That is, actual alignment signals at an AGA shot are acquired with an actual job variable and another variable. The alignment signals are compared with results by the overlay inspection apparatus, and an optimal alignment variable can be used for subsequent lots.

A case wherein an alignment offset is applied as an alignment variable whose value is decided/updated without using OAP will be explained in detail as the first embodiment.

Figure 3:
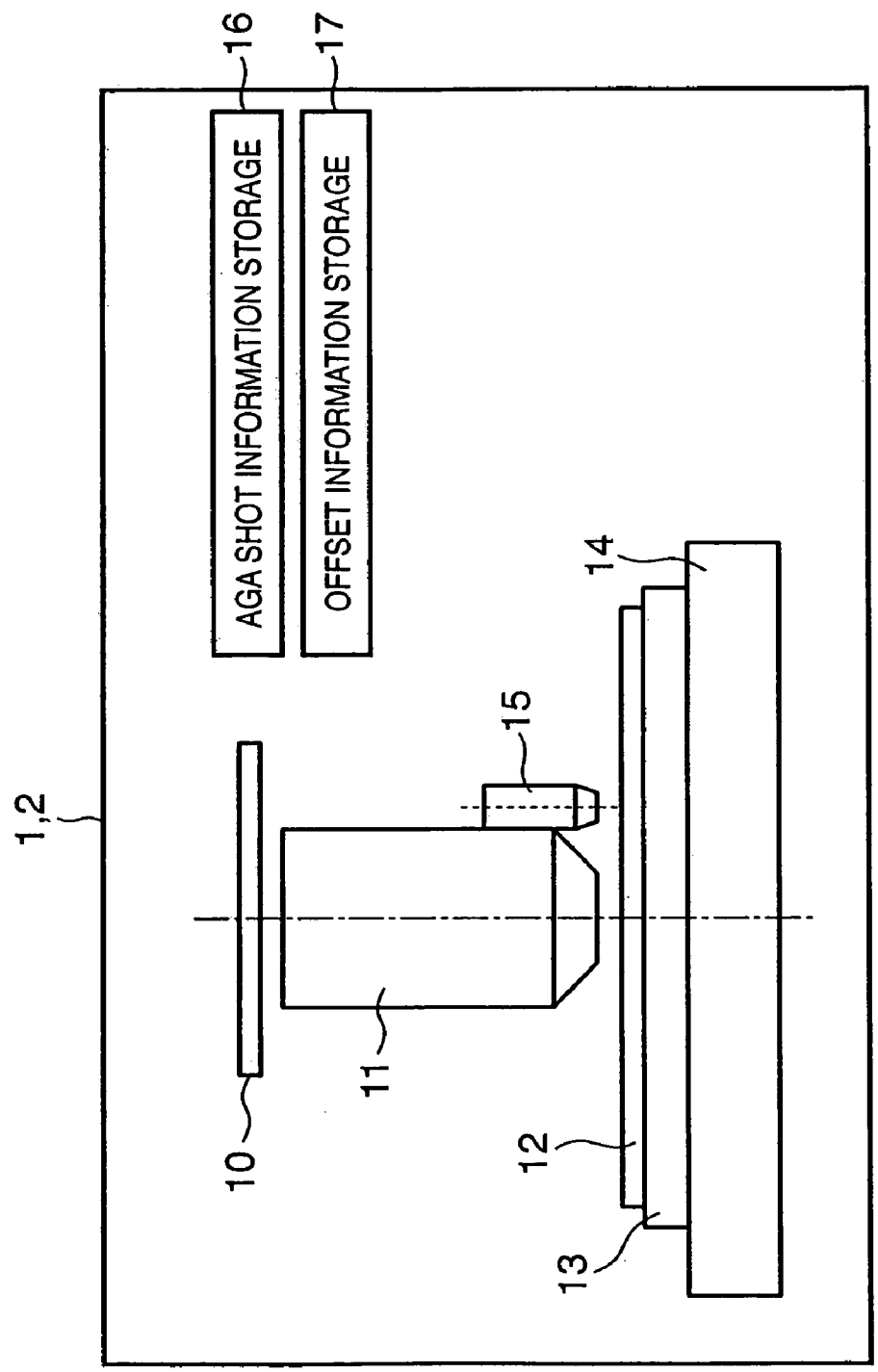
FIG. 3 is a view showing the schematic arrangement of the semiconductor exposure apparatus according to the first embodiment.

FIG. 3 is a view schematically showing the semiconductor exposure apparatus according to the first embodiment. Note that portions, except important portions in the first embodiment, are not illustrated. The exposure apparatus 1 comprises a reduction projection optical system 11, which reduces and projects a circuit pattern drawn on a reticle 10, a wafer chuck 13, which holds a wafer 12 bearing an underlying pattern and an alignment mark formed in a preprocess, a wafer stage 14, which locates the wafer 12 to a predetermined position, an alignment detection optical system 15, which measures the position of the alignment mark on the wafer, an AGA shot information storage 16, which stores a shot subjected to global alignment (AGA), and an offset information storage 17 used in positioning the wafer 12.

Figure 4:
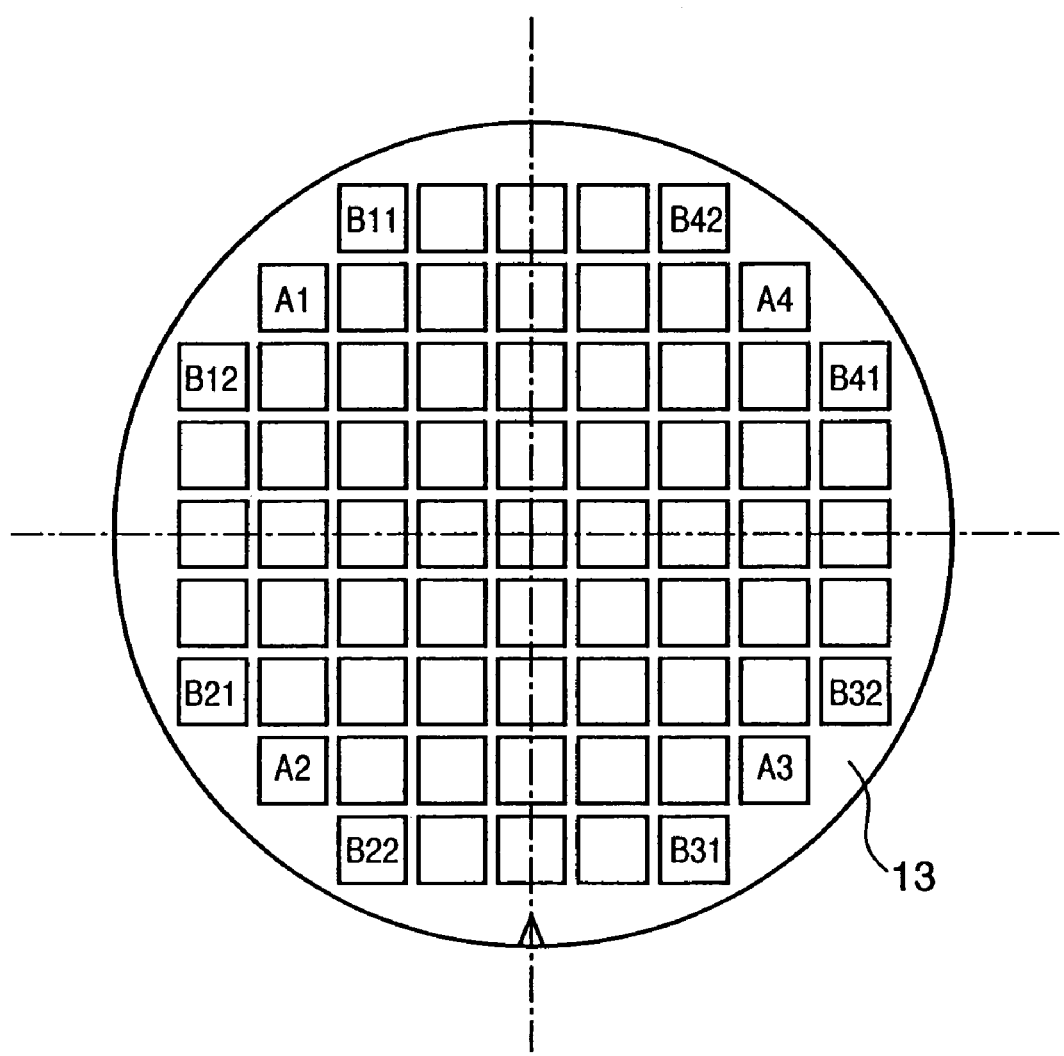
FIG. 4 is a view showing wafer shot information used in the first embodiment.

FIG. 4 shows a shot layout of the wafer 12 used in the first embodiment. In FIG. 4, AGA is executed by measuring misalignment of alignment marks formed in the areas of four shots (to be referred to as AGA sample shots) A1, A2, A3, and A4. In FIG. 4, a total of eight shots B11 to B42 are alternative sample shots used when some of the AGA measurement values of sample shots A1 to A4 are abnormal (measurement error). The measurement error occurs when, e.g., an alignment mark formation error occurs due to a semiconductor process error, failing to obtain a predetermined signal level. Whether the measurement error occurs can be decided based on, e.g., a phenomenon that the measurement value greatly shifts in comparison with the remaining shots. The AGA shot information storage 16 in the exposure apparatus 1 holds information on AGA sample shots and alternative sample shots (position coordinates on a wafer).

Figure 5:
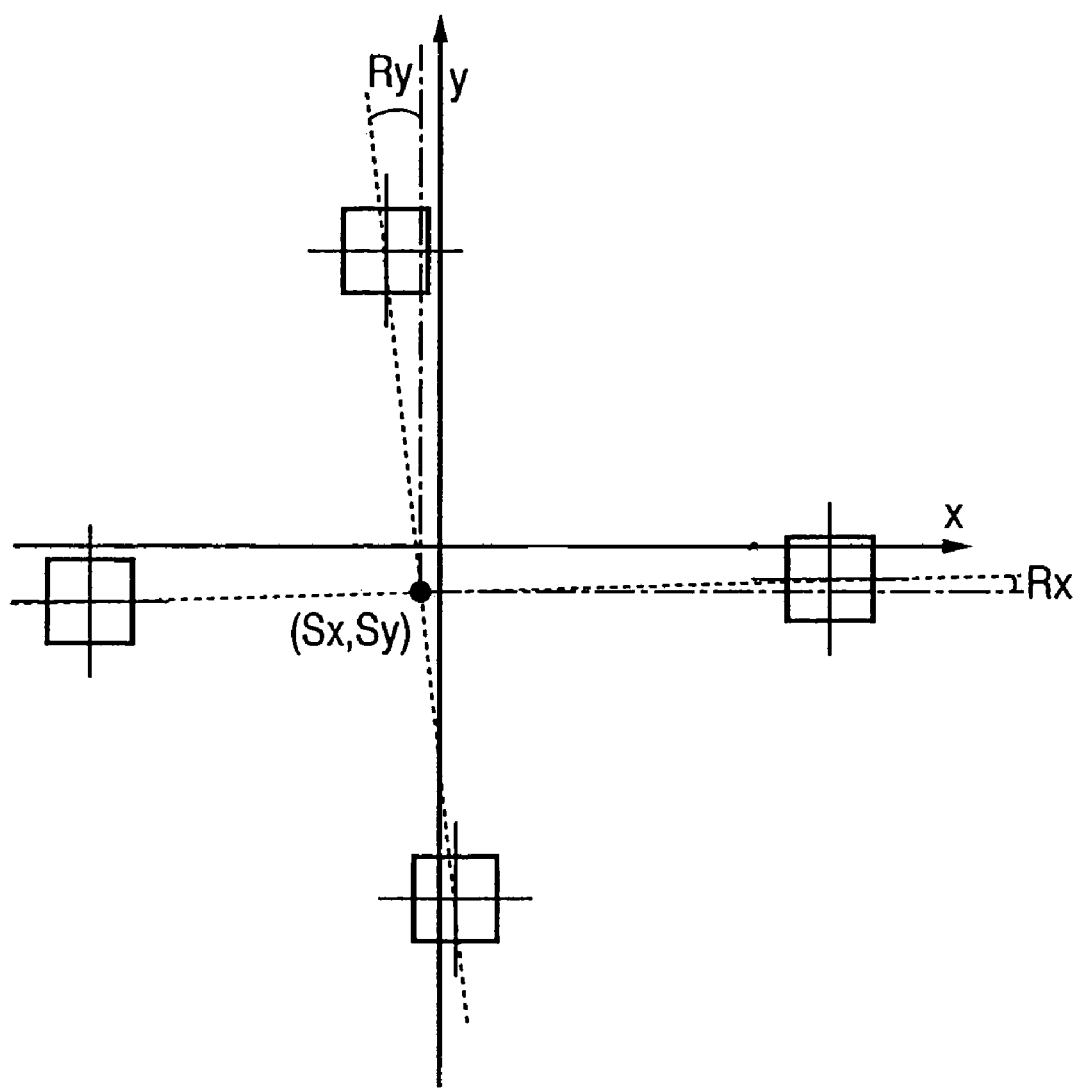
FIG. 5 is a view for explaining a global alignment parameter according to the present invention.

Global alignment (AGA) will be explained. FIG. 5 shows a stage wherein the shot layout on the wafer shifts with respect to the x-y coordinate system of the wafer stage of the exposure apparatus 1. The wafer shift can be described by six parameters: an x shift Sx, a y shift Sy, a tilt θx about the x-axis, a tilt θy about the y-axis, an x magnification Bx, and a y magnification By. The magnifications Bx and By represent expansion and contraction of the wafer with respect to the wafer stage feed of the exposure apparatus. The wafer expands and contracts owing to film formation and etching in a semiconductor process.

Let $A_i$ (i is the measurement shot number) be the measurement value of each AGA sample shot:

$$A_i = \begin{pmatrix} x_i \\ y_i \end{pmatrix}. \tag{1}$$

Let $D_i$ be the alignment mark design position coordinates of the sample shot:

$$D_i = \begin{pmatrix} X_i \\ Y_i \end{pmatrix}. \tag{2}$$

In AGA, the following linear coordinate transformation is conducted using, as correction amounts, the six correction parameters (Sx, Sy, θx, θy, Bx, and By) representing wafer misalignment:

$$D'_i = \begin{pmatrix} Bx & -\theta y \\ \theta x & By \end{pmatrix} D_i + \begin{pmatrix} Sx \\ Sy \end{pmatrix}. \tag{3}$$

In equation (3), θx≈0, θy≈0, Bx≈1, and By≈1, and approximations such as cosθ=1, sinθ=θ, θx×Bx=θx, and θy×By=θy are used for descriptive convenience.

Figure 6:
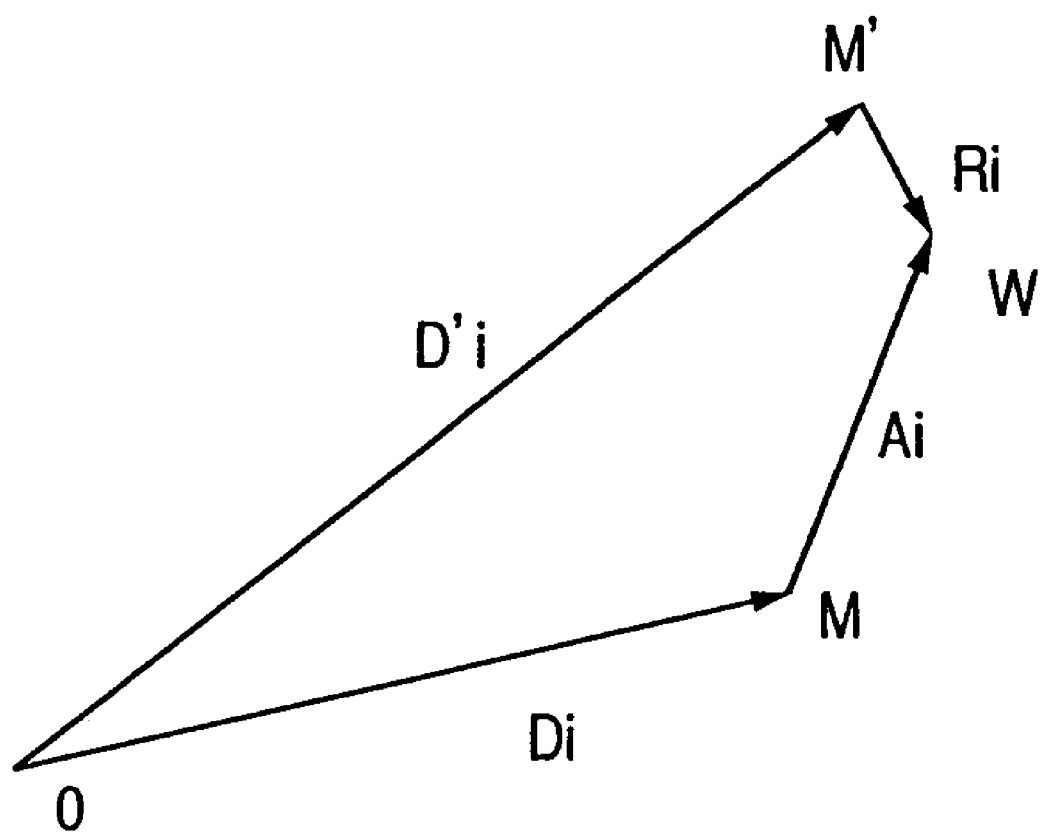
FIG. 6 is a view for explaining coordinate transformation in global alignment according to the present invention.

FIG. 6 shows linear coordinate transformation in equation (3). An alignment mark on a wafer is located at a position W, and shifts from a design position M by $A_i$. The misalignment (residual) between $D'_i$ (position M') obtained by coordinate transformation in equation (3) and the alignment mark W on the wafer is $R_i$.

$$R_i = (D_i + A_i) - D'_i. \tag{4}$$

In AGA, the correction parameters are so adjusted as to minimize the residual $R_i$ at each sample shot by applying the least squares method. That is, the correction parameters (Sx, Sy, θx, θy, Bx, and By), which minimize the mean square sum of the residual $R_i$, are calculated by:

$$V = \frac{1}{n}\sum |R_i|^2 \tag{5}$$

$$= \frac{1}{n}\sum_{i=1}^{i=n}\left| \begin{pmatrix} x_i \\ y_i \end{pmatrix} - \begin{pmatrix} Bx-1 & -\theta y \\ \theta x & By-1 \end{pmatrix}\begin{pmatrix} X_i \\ Y_i \end{pmatrix} + \begin{pmatrix} Sx \\ Sy \end{pmatrix} \right|^2$$

$$\begin{pmatrix} \delta V/\delta Sx \\ \delta V/\delta Sy \\ \delta V/\delta Rx \\ \delta V/\delta Ry \\ \delta V/\delta Bx \\ \delta V/\delta By \end{pmatrix} = 0. \tag{6}$$

A measurement value $(x_i, y_i)$ and an alignment mark design position $(X_i, Y_i)$ at each sample shot are substituted into equations (5) and (6), obtaining the correction parameter values (Sx, Sy, θx, θy, Bx, and By). After AGA measurement, the misalignment is corrected using the values of the correction parameters (to be also referred to as AGA parameters) obtained in this way, positioning each shot. A pattern on a reticle is then transferred onto the wafer.

The processing sequences of the exposure apparatus and central processing unit 4, according to the first embodiment, will be described.

Figure 7A:
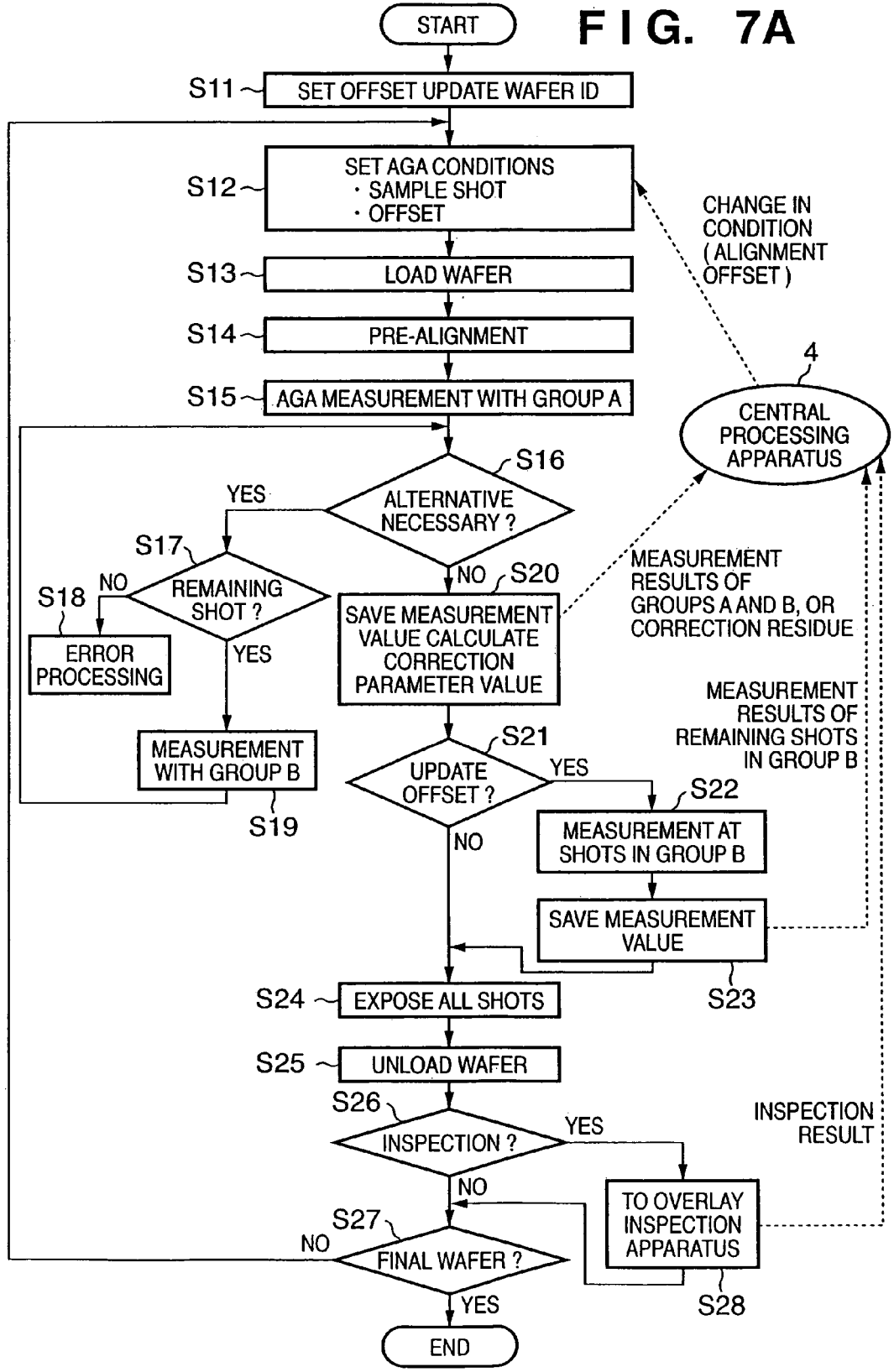
FIG. 7A is a view showing the flow chart of the exposure apparatus and data exchange between an overlay inspection apparatus and a central processing unit according to the first embodiment.

FIG. 7A is a flow chart for explaining the processing sequence of the exposure apparatus according to the first embodiment. The exposure apparatus receives, from the central processing unit 4, ID information of a wafer to be exposed by the exposure apparatus. The exposure apparatus sets the wafer ID (wafer identification number) used for offset update processing out of the ID information (step S11). A wafer subjected to offset update processing may be periodically automatically set by the central processing unit 4 or manually set by the operator. AGA conditions are set for AGA processing. At this time, the values of alignment parameters (e.g., sample shot information, alignment offset, and the like) used for AGA are set (step S12). A wafer with a wafer ID is loaded (step S13), and pre-alignment for aligning a wafer within the measurement range of subsequent AGA is performed (step S14).

AGA measurement is done at sample shots designated by sample shot information set in step S12. In the first embodiment, AGA measurement is executed at sample shots in group A (A1 to A4) (step S15).

Whether measurement of an alternative sample shot is necessary is decided on the basis of the measurement values in step S15 (e.g., when some measurement values are erroneous) (step S16). If YES in step S16, whether an (unused) alternative sample shot group remains is decided (step S17). If NO in step S17, error processing is done such that the operator is notified of a message to this effect (step S18). If YES in step S17, AGA measurement is executed at a usable alternative sample shot (in the first embodiment, a sample shot in group B) (step S19). This measurement value replaces a measurement value excluded from the sample shots, and then whether an alternative sample shot is necessary is decided again in step S16.

If NO in step S16, correction parameter values (i.e., global alignment measurement data values) are calculated (step S20). The calculated correction parameter values are saved in the exposure apparatus in association with the wafer ID together with the AGA measurement values and correction residue (step S20).

The offset update wafer ID set in step S11 and the wafer ID during processing are collated to decide whether to perform offset update processing for the current wafer (step S21). For the wafer subjected to offset update processing, AGA measurement is also done at the remaining shots in group B (step S22). In AGA measurement, the correction parameter values calculated in step S20 are reflected to drive the wafer stage. After measurement of all the remaining shots belonging to group B ends in step S22, the measurement values are saved in the exposure apparatus in association with the wafer ID (step S23).

As for a wafer decided in step S21 not to undergo offset update processing or a wafer having undergone measurement for offset update processing in step S23, the correction parameter values calculated in step S20 are reflected to drive the wafer stage and expose all the shots (step S24). After exposure, the wafer is unloaded (step S25), and whether to shift the wafer to the overlay inspection step is decided (step S26). In the first embodiment, all wafers decided from the wafer IDs to undergo offset update processing are shifted to the inspection step (step S28). Whether the wafer is a final one is decided in step S27, and if NO, the processing returns to step S12.

Note that the wafer ID, AGA measurement values, correction parameter values, and correction residue, which are stored in the apparatus in step S20, and the measurement values stored in the apparatus in step S23 are transferred to the database 5 via the central processing unit 4 when, e.g., the burden on the exposure apparatus is small in accordance with the operating state of the exposure apparatus.

Inspection results by the overlay inspection apparatus 3 are also transferred to the database 5 via the central processing unit 4, and saved in association with the wafer ID together with the AGA measurement values, and the like.

Figure 7B:
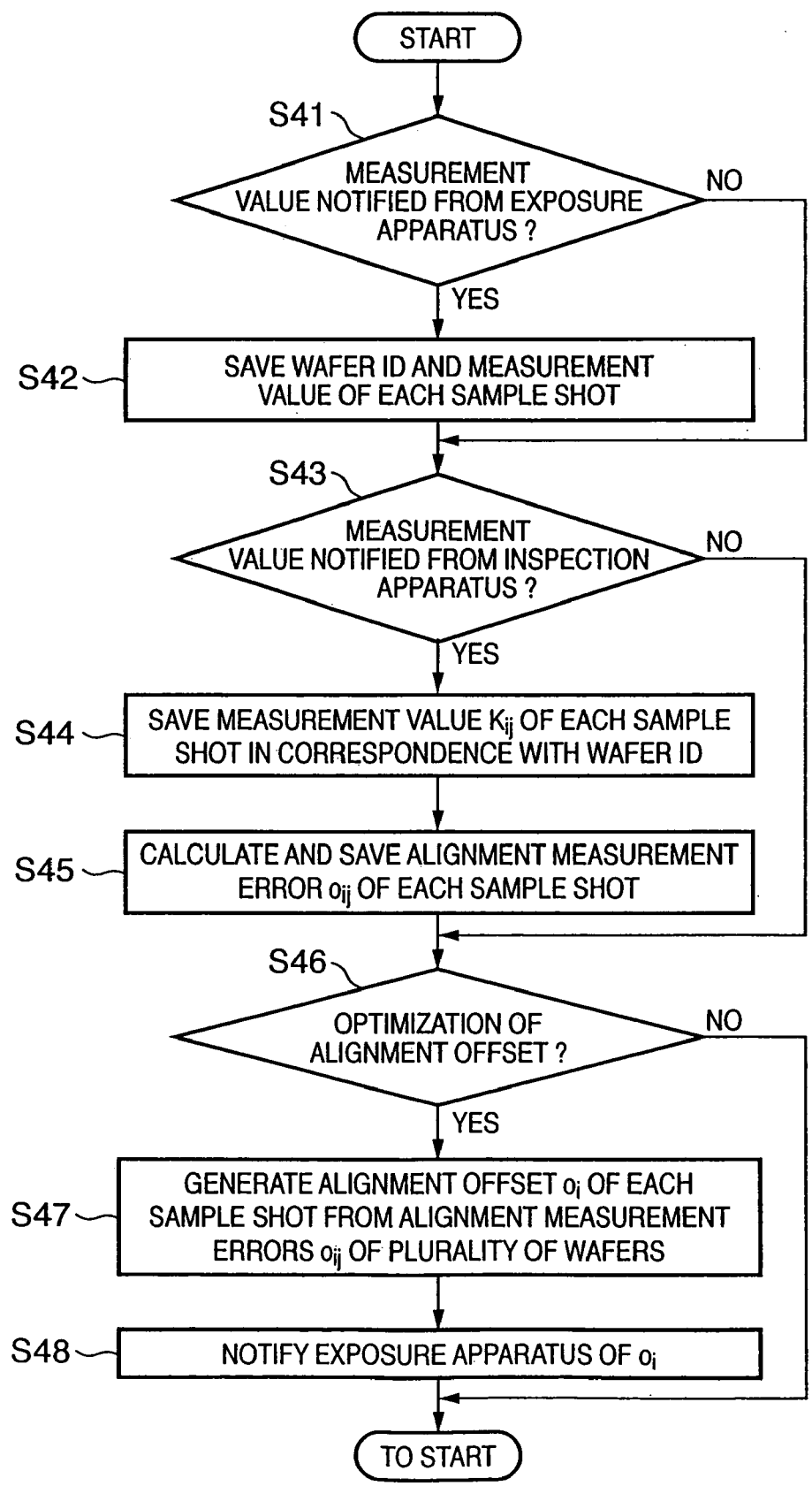
FIG. 7B is a flow chart for explaining processing of the central processing unit according to the first embodiment.
Figure 7C:
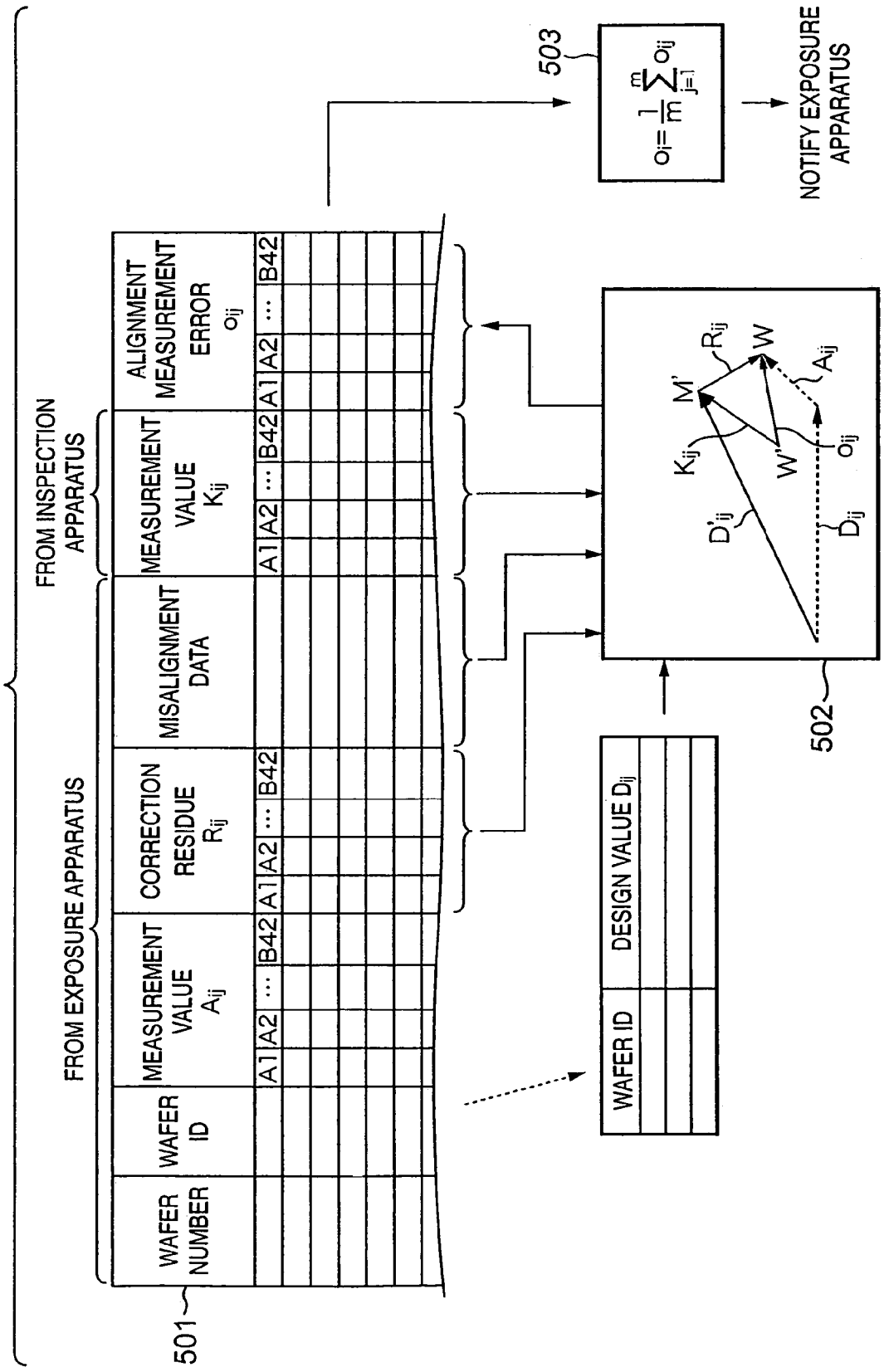
FIG. 7C is a view for explaining alignment offset optimization processing according to the first embodiment.

Alignment offset optimization processing in the central processing unit 4 will be explained in detail. FIG. 7B is a flow chart for explaining a processing sequence in the central processing unit. FIG. 7C is a view for explaining alignment offset optimization processing in the central processing unit.

Whether the central processing unit 4 has been notified of AGA measurement values from the exposure apparatus is decided (step S41). If YES in step S41, the central processing unit 4 assigns a wafer number j to the AGA measurement values, and saves the wafer ID and the AGA measurement value for each sample shot in the database 5. For example, as represented by 501 in FIG. 7C, an AGA measurement value $A_i$ and correction residue $R_i$ received from the exposure apparatus are stored for each wafer and each sample shot (A1, . . . , B42) (in FIG. 7C, the measurement value of a wafer j is $A_{ij}$, and the correction residue of the wafer j is $R_{ij}$) (i is the shot number). Calculated correction parameter values are stored in correspondence with each wafer ID.

The central processing unit 4 decides whether it has been notified of an inspection result from the overlay inspection apparatus 3 (step S43). If YES in step S43, the central processing unit 4 stored in the database 5 the inspection result as a measurement value $K_{ij}$ (i is the shot number on a wafer, and j is the afer number) for each sample shot (step S44).

The central processing unit 4 calculates an alignment measurement error $o_{ij}$ for each sample shot on the basis of the above-described data. The central processing unit 4 calculates the alignment measurement error $o_{ij}$ at each AGA sample shot by using the correction residue of each AGA shot (difference between the measurement value $A_{ij}$ of each AGA shot and the position $D'_{ij}$ by the correction parameters calculated in step S20), the value (also corresponding to a correction residue because of measurement after AGA correction driving) $R_{ij}$ measured in step S22, and the measurement value $K_{ij}$ of the overlay inspection apparatus 3.

More specifically, the correction parameter values and the design values $D_{ij}$, $R_{ij}$, $K_{ij}$, and $o_{ij}$ have a relationship as represented by 502 in FIG. 7C. Thus, $o_{ij}$ is calculated from equation (7) and saved in the database 5 (step S45). Note that in relationship 502, $D'_{ij}$ is obtained by linearly transforming the sample shot position design value $D_{ij}$ held in the database 5 by the correction parameter values notified from the exposure apparatus.

$$o_{ij} = K_{ij} + R_{ij} = \begin{pmatrix} Kx_{ij} + Rx_{ij} \\ Ky_{ij} + Ry_{ij} \end{pmatrix} \quad (7)$$

Whether to execute optimization of the alignment offset is decided (step S46). For example, optimization of the alignment offset is executed every time five wafers are processed.

If YES in step S46, the mean value of alignment measurement errors of a predetermined number m of wafers is calculated for each sample shot, obtaining the alignment offset $o_i$ of each shot (step S47 and 503 in FIG. 7C).

$$o_i = \begin{pmatrix} xo_i \\ yo_i \end{pmatrix} = \frac{1}{m} \sum_{j=1}^{m} o_{ij} \quad (8)$$

The offset $o_i$ is transferred to the exposure apparatus 1 (step S48), and the alignment offset is updated in step S12 described above. Note that the mean value is calculated for a predetermined number m of wafers, but m may be accumulated. In this case, to optimize the alignment offset for, e.g., five wafers, m is incremented to 5, 10, 15. . . .

The exposure apparatus sets the alignment offset $o_i$ notified in step S12 in AGA processing conditions. If the alignment offset $o_i$ is set in the exposure apparatus, equation (1) is rewritten into $$A'_i = \begin{pmatrix} x_i - xo_i \\ y_i - yo \end{pmatrix} \quad (9)$$

and then AGA processing is performed.

Figure 8:
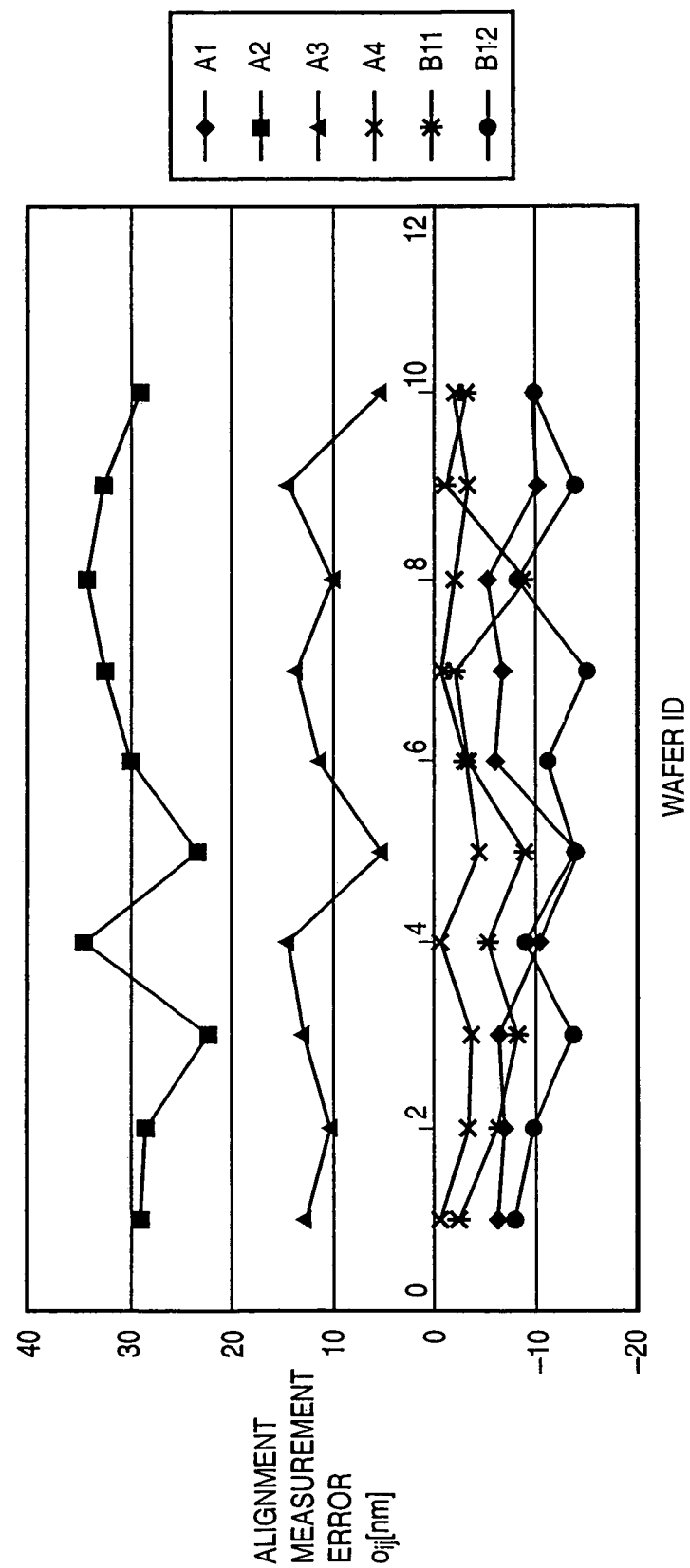
FIG. 8 is a graph showing a measurement example of the alignment measurement error for each sample shot.

FIG. 8 shows the measurement result of the alignment error $o_{ij}$ at respective sample shots (all shots in group A, and shots B11 and B12 in group B are illustrated). Each shot exhibits a systematic error, and the AGA precision (overlay precision) can be increased by introducing the mean value as an offset.

The systematic offset error depending on the shot position occurs because the measurement error of the alignment system in the exposure apparatus is generated under the influence of coating nonuniformity of the resist on the alignment mark, the film thickness distribution of the underlying alignment mark, or asymmetry.

As described above, according to the first embodiment, AGA measurement is performed at sample shots, including alternative sample shots during volume production. Measurement values and inspection results by the overlay inspection apparatus are properly accumulated to update the alignment offset. This can increase the productivity and yield. Even if the alignment mark of a sample shot, which is generally used, becomes abnormal under the influence of the process and AGA is executed at an alternative sample shot, since the alignment offset of the alternative sample shot can also be held, a high alignment precision is realized.

The present invention has described the alignment offset optimization method in the volume production in a semiconductor manufacturing process. The present invention can also be applied to a condition setting step using a preceding wafer that is executed prior to volume production. In obtaining an alignment offset, including that of an alternative sample shot, the first embodiment can eliminate the need for pre-exposure in a combination of all sample shots, decrease the number of wafers and shorten the condition setting step.

Second Embodiment

The second embodiment according to the present invention will be described. In the second embodiment, a sample shot group used for global alignment is adopted as an alignment variable to be optimized, in addition to the alignment offset used for global alignment. OAP, described above, is adopted for optimization of the sample shot group. In this case, the parameter to be optimized is the sample shot group, and the parameter value represents a choice.

The system arrangement, and the like, are the same as those in the first embodiment except that an AGA shot information storage 16 according to the second embodiment in an exposure apparatus 1 of FIG. 3 stores shot position information generally used in AGA, shot position information used for an alternative, and shot position information subjected to OAP processing for the third sample shot group. An AGA offset information storage 17 stores alignment offsets in correspondence with all shots for pieces of shot position information of the three types.

Figure 9:
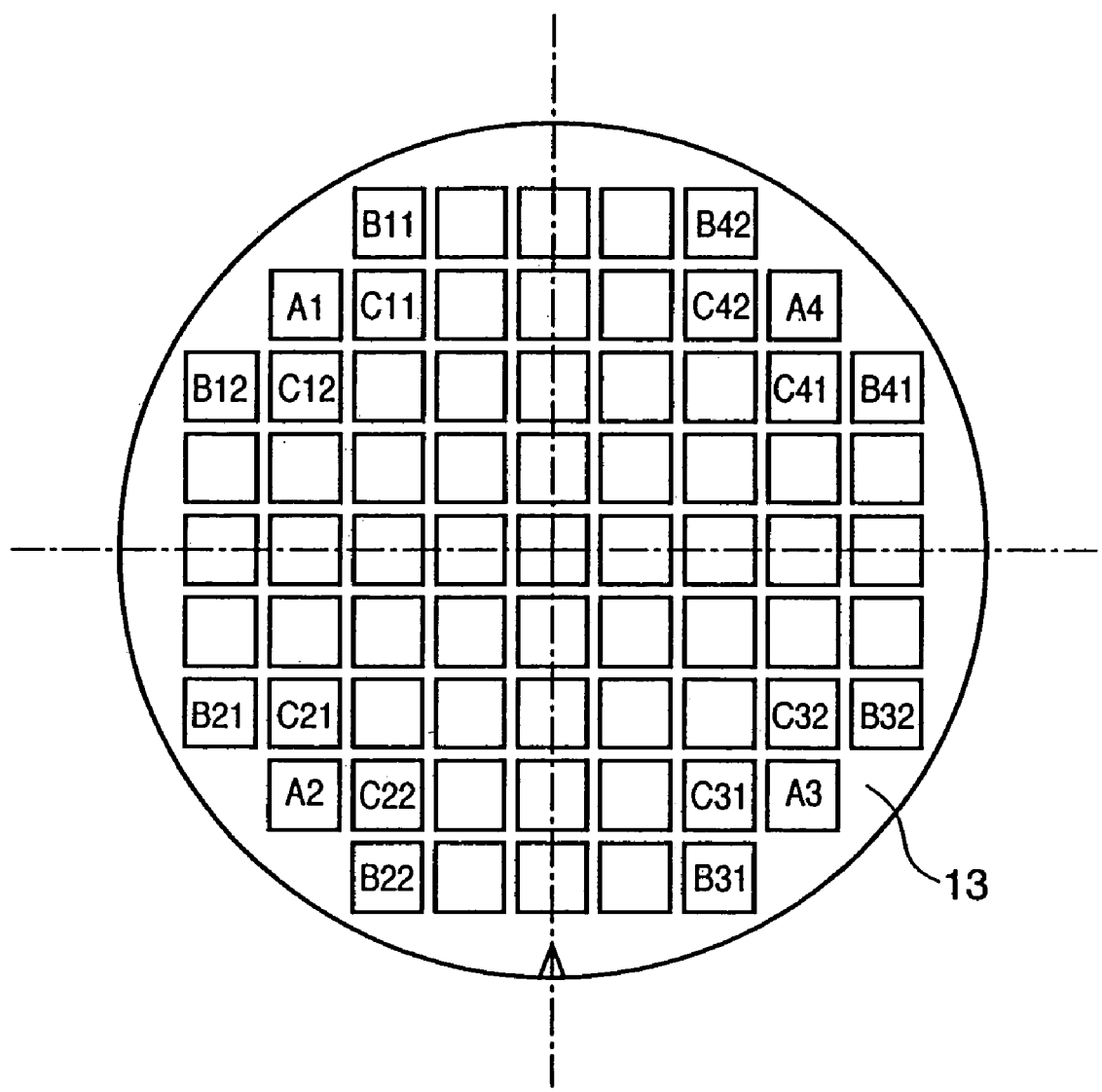
FIG. 9 is a view showing wafer shot information used in the second embodiment.

FIG. 9 is a view showing a shot layout of a wafer 12 used in the second embodiment. In FIG. 9, four shots (sample shots in group A) A1, A2, A3, and A4 represent shot positions generally used in AGA, and AGA is executed by measuring misalignment of alignment marks. In FIG. 9, a total of eight shots (sample shots in group B) B11 to B42 are alternative sample shots used when some of the AGA measurement values of sample shots A1 to A4 are abnormal. Shots (sample shots in Group C) C11 to C42 are set to execute OAP processing to be described later.

Figure 10A:
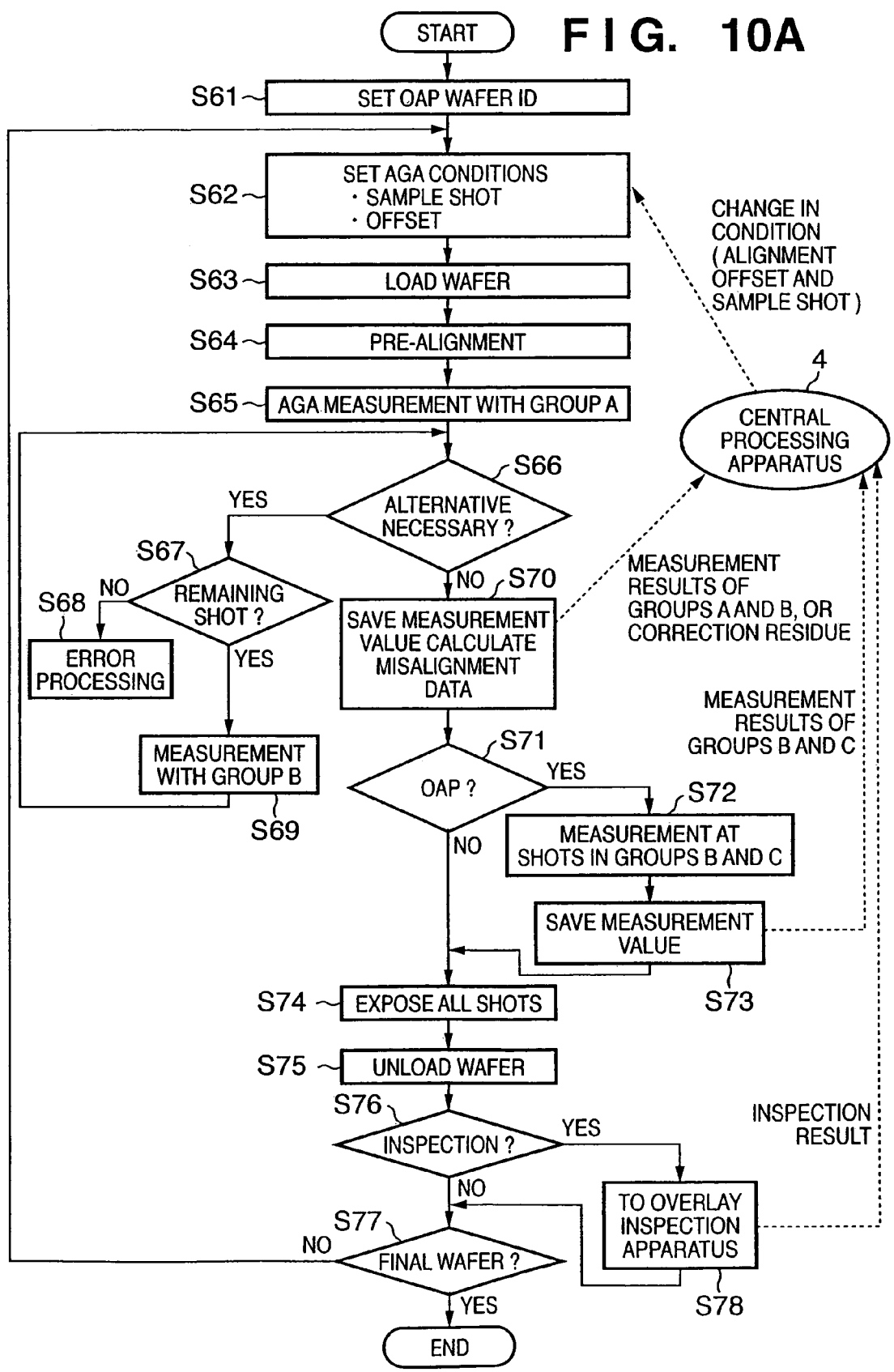
FIG. 10A is a view showing the flow chart of a semiconductor exposure apparatus used in the second embodiment, and data exchange between an overlay inspection apparatus and a central processing unit.

The processing sequences of the exposure apparatus according to the second embodiment will be described with reference to FIG. 10A. In FIG. 10A, the exposure apparatus receives, from a central processing unit 4, ID information of a wafer to be exposed by the exposure apparatus. The exposure apparatus sets the wafer ID (wafer identification number) used for OAP processing out of the ID information (step S61). A wafer subjected to OAP processing may be automatically set by the central processing unit 4 with a rule such as periodicity, or manually set by the operator.

AGA conditions are set, and sample shots and alignment offsets are set (step S62). A wafer with a wafer ID is loaded (step S63), and pre-alignment for aligning a wafer within the measurement range of subsequent AGA is performed (step S64). AGA measurement is done at sample shots in group A on the basis of sample shot information set in step S62 (step S65). Whether measurement of an alternative sample shot is necessary is decided on the basis of the measurement values (e.g., when some measurement values are erroneous) (step S66).

If YES in step S66, whether an alternative sample shot remains is decided (step S67). If NO in step S67, error processing is done such that the operator is notified of a message to this effect (step S68). If YES in step S67, AGA measurement is executed at a sample shot in group B (step S69). This measurement value is added, and whether an alternative sample shot is necessary is decided again in step S66. If NO in step S66, correction parameter values, correction parameters, and correction residue are saved in the apparatus in association with the wafer ID (step S70).

The wafer ID is collated with the OAP wafer ID set in step S62 to decide whether to perform OAP processing for the current wafer (step S71). For the wafer subjected to OAP processing, AGA measurement is also done at the remaining shots in group B and shots in group C (step S72). In AGA measurement in step S72, the correction parameters calculated in step S70 are reflected to drive the wafer stage. After measurement of all the remaining shots belonging to group B and all shots belonging to group C ends in step S72, the measurement values are saved in the apparatus (step S73).

As for a wafer decided in step S71 not to undergo OAP processing or a wafer having undergone measurement for OAP processing in steps S27 and S73, the correction parameters in step S70 are reflected to position the wafer stage and expose all the shots (step S74). After all the shots are exposed, the wafer is unloaded (step S75), and whether to transfer the wafer to the overlay inspection step is decided (step S76). In the second embodiment, all wafers with wafer IDs subjected to OAP processing are shifted to the inspection step. Whether the wafer is a final one is decided in step S77, and if NO, the processing returns to step S62.

Note that the wafer ID, AGA measurement values, correction parameters, and correction residue, which are stored in the apparatus in step S70, and the measurement values of the remaining sample shots in group B in step S73 are transferred to a database 5 via the central processing unit 4 when, e.g., the burden is small in accordance with the operating state of the exposure apparatus. Inspection results by an overlay inspection apparatus 3 are also transferred to the database 5 via the central processing unit 4, and saved in association with the wafer ID together with the AGA measurement values, and the like.

The central processing unit 4 performs two processes:
(1) to calculate the alignment offset of each sample shot; and
(2) to decide which sample shot is optimal among sample shots.

Process (1) is the same as that in the first embodiment, and the alignment offset $o_i$ of each sample shot is calculated using equations (7) and (8). The calculated alignment offset is transferred to the exposure apparatus 1 to update the alignment offset in step S62. Process (1) is the same as that in the first embodiment, and a detailed description thereof will be omitted.

Figure 10B:
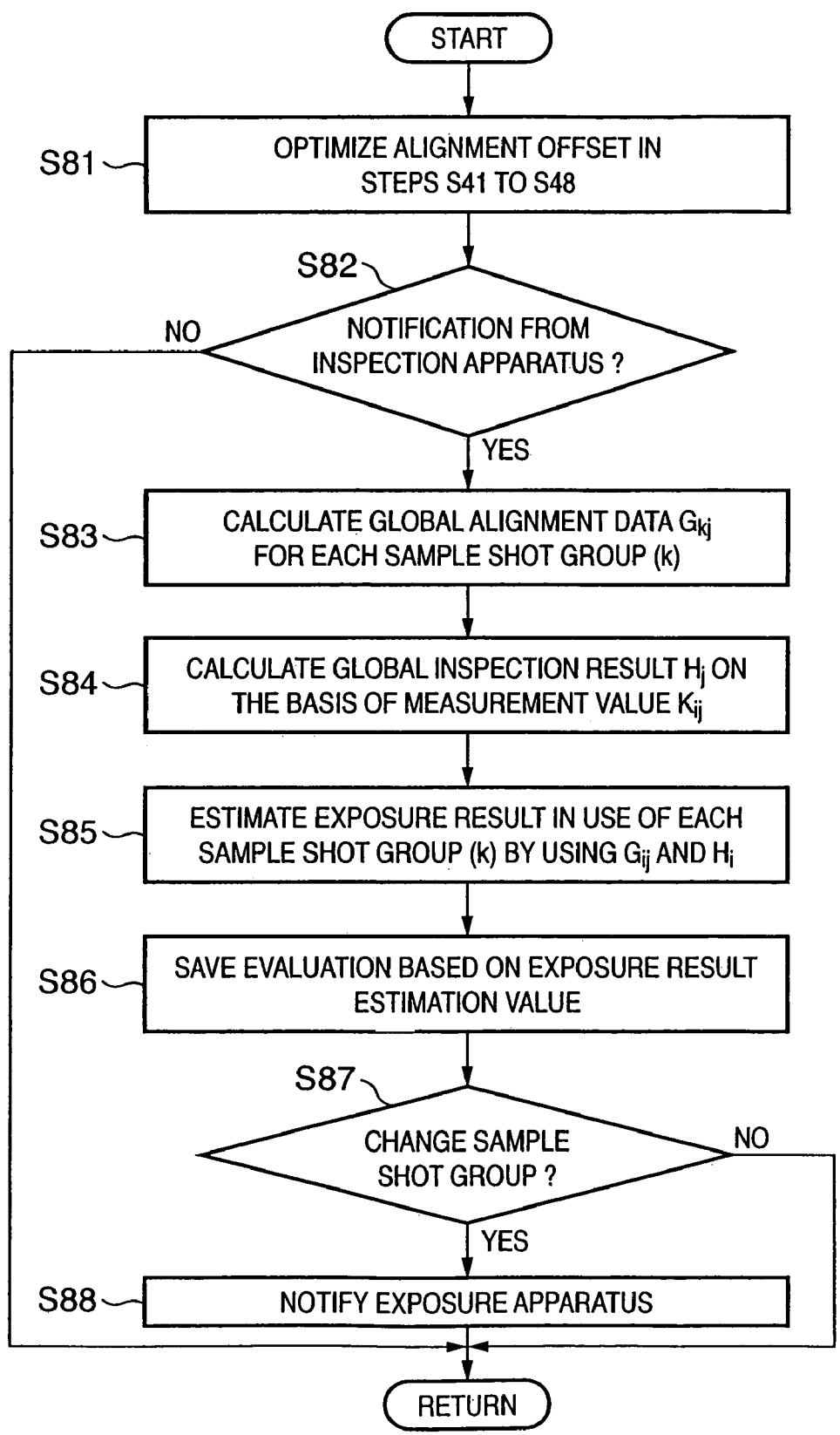
FIG. 10B is a flow chart for explaining processing of the central processing unit according to the second embodiment.

Process (2), i.e., a sample shot group optimization method will be described in detail with reference to FIGS. 10B and 10C. FIG. 10B is a flow chart showing the processing sequence of the central processing unit 4 according to the second embodiment. FIG. 10C is a view for explaining sample shot group optimization processing according to the second embodiment.

Global alignment measurement data $\{G_j=(Sx_j, Sy_j, Bx_j, By_j, \theta x_j, \theta y_j)\}$: j is the wafer number) provides different calculation results depending on each sample shot group. A suffix "k" is added into $G_{kj}=(Sx_{kj}, Sy_{kj}, Bx_{kj}, By_{kj}, \theta x_{kj}, \theta y_{kj})$.

As for the sample shot group, a plurality of combinations of sample shots are registered in advance (k=1, 2, ... in 602 of FIG. 10C), and an optimal sample shot group is selected from them. Sample shots may be selected regardless of each sample shot group, like a combination of a shot in group A and a shot in group C, as represented by k=4 in 602 of FIG. 10C. The number of sample shots is 4 in group A. In some cases, a larger number of shots is more advantageous to precision. Thus, sample shots are optimized during the number of shots as a parameter in OAP processing (sample shot groups with different numbers of shots are registered).

Further, as represented by k=3 in 602 of FIG. 10C, the wafer may be divided into a plurality of regions to set sample shots used in each region. In this case, in exposure processing on the exposure apparatus side, (1) the entire layout is divided into a plurality of regions. (2) Sample shots corresponding to each region (sample shots at the periphery of each region are preferably used) are adopted and subjected to AGA processing. (3) Misalignment data is obtained for each region, and (4) the shot of each region is positioned on the basis of the misalignment data of the region and exposed. This method is particularly effective when the shot layout is nonlinearly distorted, but regarded to be linearly distorted in each region. Whether sample shots are selected for each region or at once is also used to optimize a parameter value in the second embodiment.

A case wherein the wafer is divided into regions to obtain misalignment data will be described for, e.g., k=3 in 602 of FIG. 10C. For example, in FIG. 9, the 3σ value of the misalignment amount of all shots on a wafer is estimated from a result of exposing the outermost shots of a wafer using sample shots {A1, A2, A3, A4} and a result (estimation value) of exposing shots of the wafer except the outermost shots using sample shots {C11, C21, C31, C41}. The estimated result is defined as an exposure result (3σ value) obtained when AGA sample shots are set in each region. An exposure result (3σ value) obtained when all shots on the wafer are positioned using only AGA sample shots {A1, A2, A3, A4} and an exposure result (3σ value) obtained when AGA sample shots in each region are compared. If the setting of AGA sample shots in each region has an advantage to precision as a result of comparison, sample shots are optimized so as to set AGA sample shots in each region.

The wafer is radially divided into regions on the assumption that the wafer nonlinearly expands or contracts in the radial direction owing to a semiconductor process such as film formation or etching. Division into regions is not limited to radial division.

Global alignment data $G_{kj}$ measured with a sample shot k is calculated by selecting only a measurement result contained in the sample shot group k from correction residues $R_{ij}$ (i is the shot number on a wafer, and j is the wafer number) measured in step S70 and values (also corresponding to correction residues $R_{ij}$ because of measurement after AGA correction driving) measured in step S72, and substituting the measurement result into equations (5) and (6) (603 in FIG. 10C). A result $H_{kj}$ of exposure using the alignment data $G_{kj}$ of the sample shot group k is estimated as $H_{kj}=G_{kj}+H_j$ (604 in FIG. 10C).

In this case, $H_j$ is a global inspection result calculated by measuring a plurality of shots (or all shots) on wafer number j by the overlay inspection apparatus 3, setting the position coordinate of an overlay inspection mark as $D_i$, and substituting a measurement result as $A_i$ into equations (1) to (6), similarly to AGA data (605 in FIG. 10C). $H_j$ and $H_{kj}$ are $H_j=(S'x_j, S'y_j, B'x_j, B'y_j, \theta'x_j, \theta'y_j)$ and $H_{kj}=(S'x_{kj}, S'y_{kj}, B'x_{kj}, B'y_{kj}, \theta'x_{kj}, \theta'y_{kj})$.

The processing sequence of the central processing unit 4 will be further explained with reference to the flow chart of FIG. 10B.

In step S81 of FIG. 10B, processes in steps S41 to S48, described in the first embodiment, are executed. That is, an AGA measurement value and a measurement value are respectively acquired from the exposure apparatus and overlay inspection apparatus 3, and stored in the database 5 to execute optimization of the alignment offset.

In step S82, whether a new measurement value sent from the overlay inspection apparatus 3, which has been stored in step S44, is determined. If YES in step S82, the processing advances to step S83 to estimate an exposure result for each sample shot group in subsequent processes by using the new measurement value, i.e., the measurement value $K_{ij}$ from the overlay inspection apparatus 3 for each shot i of the wafer number j.

In step S83, the global alignment data $G_{kj}$ is calculated for each sample shot group k by the above-mentioned method using the stored correction residue $R_{ij}$ (603 in FIG. 10C). In step S84, the correction amount $H_j$ is calculated for the wafer j from the measurement value $K_{ij}$ from the overlay inspection apparatus 3 (605 in FIG. 10C). In step S85, an exposure result for each sample shot group k is estimated from $H_{kj}=G_{kj}+H_j$.

In step S86, positioning is evaluated on the basis of the estimation result in step S85. For example, the alignment error estimation amount and wafer magnification error estimation amount are evaluated from the exposure result estimation value (604 in FIG. 10C). The evaluation values are stored in the database 5 in correspondence with the wafer ID (j). The evaluation contents will be described later. In step S87, whether to optimize the sample shot group is determined on the basis of the evaluation values stored in step S86. If YES in step S87, the processing advances to step S88. In step S88, an optimal sample shot group is selected on the basis of the exposure result estimation value stored in the database 5, and the exposure apparatus is notified of the selected sample shot group.

Evaluation based on the exposure estimation result and determination whether to optimize a sample shot group will be explained. FIG. 11 is a graph showing data as a result of acquiring an evaluation value (wafer magnification component) for a wafer during a step in the semiconductor manufacturing process according to the second embodiment. FIG. 11 shows a wafer magnification component obtained by performing global alignment using sample shot group A and measuring an exposed wafer by the overlay inspection apparatus 3, and a wafer magnification component based on a virtual exposure result in sample shot group A' decided to be optimal in OAP processing executed at the same time. The wafer magnification component error is 0.15 ppm (3σ) in the use of sample shot group A. To the contrary, the use of sample shot group A' can reduce the error component to 0.07 ppm.

The mean value of sample shot group A' changes around 0 from wafer number "6" because the alignment offset of each shot belonging to sample shot group A' is updated (optimized) on the basis of the processing results of wafers up to the fifth wafer. When such an evaluation value is obtained, the central processing unit 4 notifies the exposure apparatus that sample shot group A' is to be used for AGA instead of sample shot group A.

The wafer magnification error is an evaluation function in the above description, but the orthogonality error of the shot layout of each wafer may be an evaluation function. As the most preferable form, variations between wafers are evaluated for all the parameters of the shift component, magnification component, and rotation component, thereby containing an optimal sample shot.

Figure 12:
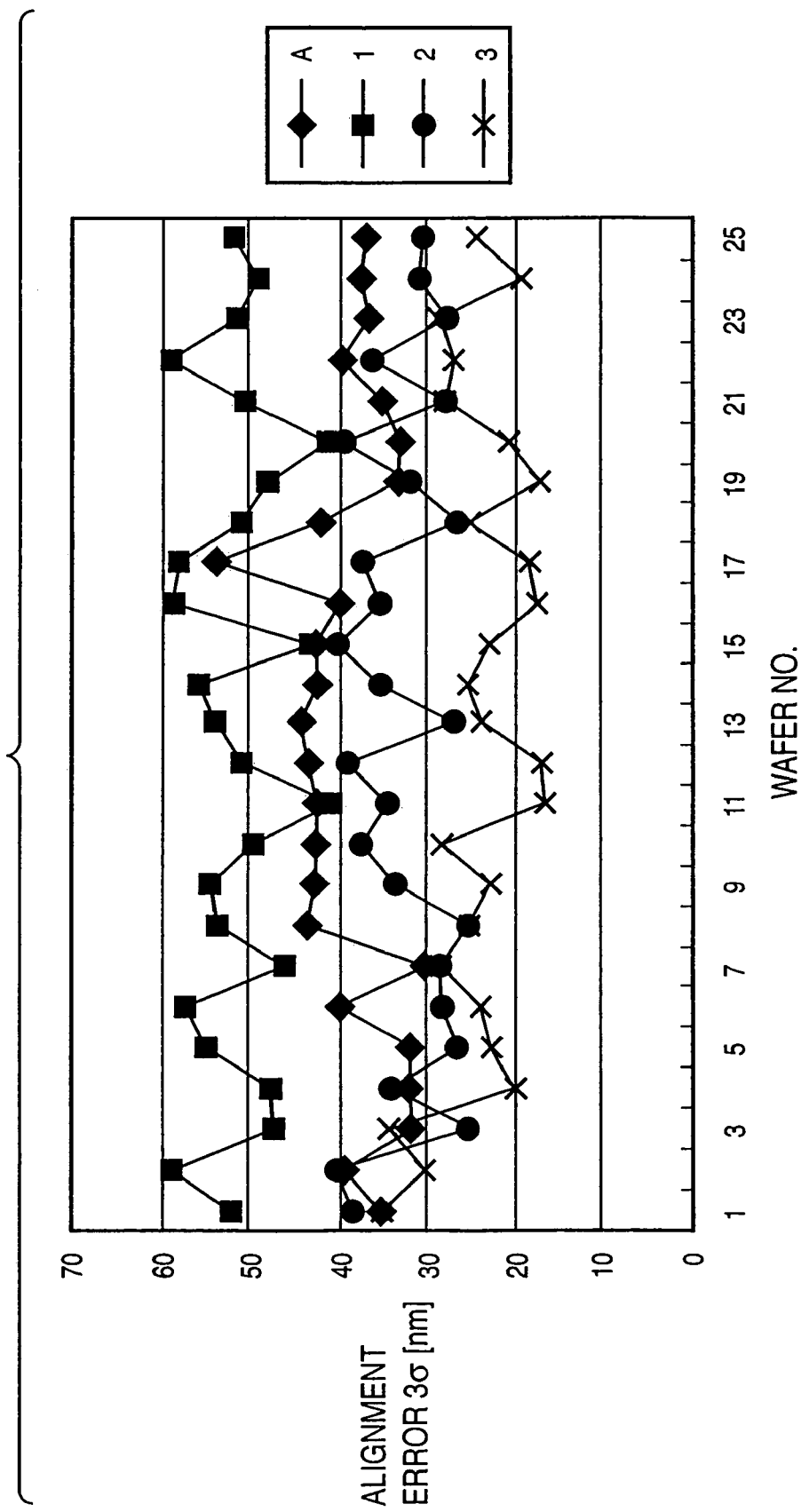
FIG. 12 is a graph for explaining optimization of a sample shot group according to the second embodiment.

FIG. 12 shows data acquired to optimize a sample shot according to the second embodiment. In FIG. 12, sample shot group A has the 3σ component of an alignment error estimation amount as a result of measuring all the shots of an exposed wafer by the overlay inspection apparatus 3 after executing global alignment. Sample shot groups 1, 2, and 3 have the 3σ components of alignment error estimation amounts when exposure is done for the respective sample shot groups by OAP processing. An alignment error estimation amount $E_{kij}$, (suffix "k" is the sample shot group number, i is the shot number, and j is the wafer number) is the sum of the measurement value $K_{ij}$ of each shot as a result of exposure and a value calculated by linearly transforming the overlay inspection mark coordinate $D_i$ by global alignment data $G_{kj}$ of each sample shot. The alignment error estimation amount $E_{kij}$ is given by $$E_{kij} = K_{ij} + \begin{pmatrix} Bx_{kj} + \theta y_{kj} \\ \theta y_{kj} + By_{kj} \end{pmatrix} D_{ij} + \begin{pmatrix} Sx_{kj} \\ Sy_{kj} \end{pmatrix}. \tag{10}$$

When the 3σ values of twenty-five wafers are averaged, the predicted 3σ component is 24 nm in the use of sample shot group 3, while 3σ is 38 nm in the use of current sample shot group A as shown in FIG. 12. From this result, the central processing unit 4 decides that the use of sample shot group 3 is optimal, and sends an instruction to this effect to the exposure apparatus 1. The exposure apparatus 1, which has received this instruction, performs AGA alignment using sample shot group 3 from the next wafer.

In this manner, the exposure result of exposing each wafer with each sample shot group is estimated, and the estimation result is accumulated in the database 5. When it is decided from the past log of wafers having undergone OAP processing that the use of not the current sample shot, but another sample shot is advantageous to precision, a change in sample shot is transmitted to the exposure apparatus 1, and the exposure apparatus 1 changes and sets the sample shot.

Note that the alignment offset of each sample shot need not be changed at the same time of changing the sample shot. It is preferable to independently change the alignment offset and sample shot, as described in the second embodiment.

The alternative sample shot is set separately from an OAP processing shot in FIG. 9, but may be directly used as an OAP processing shot.

As described above, the exposure management system and exposure apparatus according to the second embodiment can be used to optimize wafer alignment variables, and especially the alignment offset and sample shot group during the operation of the apparatus. An optimal parameter can, therefore, be used without any processing of stopping volume production by using a send-ahead wafer. If process variations occur after updating a parameter, the parameter can be replaced by an optimal one to operate the apparatus.

The second embodiment can optimize set variables in volume production in the use of the exposure apparatus without any long time and high cost in addition to volume production. The exposure apparatus can be used with high productivity and high apparatus performance. A manufacturing system with good CoO can be achieved, increasing the effective performance, productivity, and yield of the exposure apparatus.

The present invention has described the sample shot optimization method in the volume production in a semiconductor manufacturing process. The present invention can also be applied to a condition setting step using a preceding wafer that is executed prior to volume production. According to the present invention, AGA measurement is performed at sample shots including alternative sample shots and other shots. Measurement values and inspection results by the overlay inspection apparatus are properly accumulated to estimate an exposure result in global alignment using each sample shot. Pre-exposing using a combination of all sample shots need not be performed, decreasing the number of wafers and shortening the condition setting step.

The overlay inspection apparatus serving as an OAP criterion may similarly undergo variable optimization using, e.g., a scanning electron microscope SEM as a criterion.

In the above embodiments, the exposure apparatus 1 has a reduction projection optical system. However, the exposure apparatus is not limited to this, and the present invention can also be applied to an X-ray exposure apparatus which uses X-rays as an exposure light source and projects a pattern on a mask at 1:1, and an EB lithography exposure apparatus which lithographs a plurality of shots on a wafer with an electron beam (EB).

In the above embodiments, the central processing unit 4 can be a general-purpose computer system. In this case, a control program, which realizes processes described in the above embodiments, is provided to the central processing unit 4. That is, the object of the present invention is also achieved when a storage medium, which stores software program codes for realizing the functions of the above-described embodiments, is supplied to a system or apparatus, and the computer (or the CPU or MPU) of the system or apparatus reads out and executes the program codes stored in the storage medium.

In this case, the program codes read out from the storage medium realize the functions of the above-described embodiments, and the storage medium, which stores the program codes constitutes the present invention.

The storage medium for supplying the program codes includes a floppy disk, a hard disk, an optical disk, a magnetooptical disk, a CD-ROM, a CD-R, a magnetic tape, a nonvolatile memory card, and a ROM.

The functions of the above-described embodiments are realized when the computer executes the readout program codes. Also, the functions of the above-described embodiments are realized when an OS (Operating System), or the like, running on the computer performs part or all of actual processing on the basis of the instructions of the program codes.

The functions of the above-described embodiments are also realized when the program codes read out from the storage medium are written in the memory of a function expansion board inserted into the computer or the memory of a function expansion unit connected to the computer, and the CPU of the function expansion board or function expansion unit performs part or all of actual processing on the basis of the instructions of the program codes.

Figure 13:
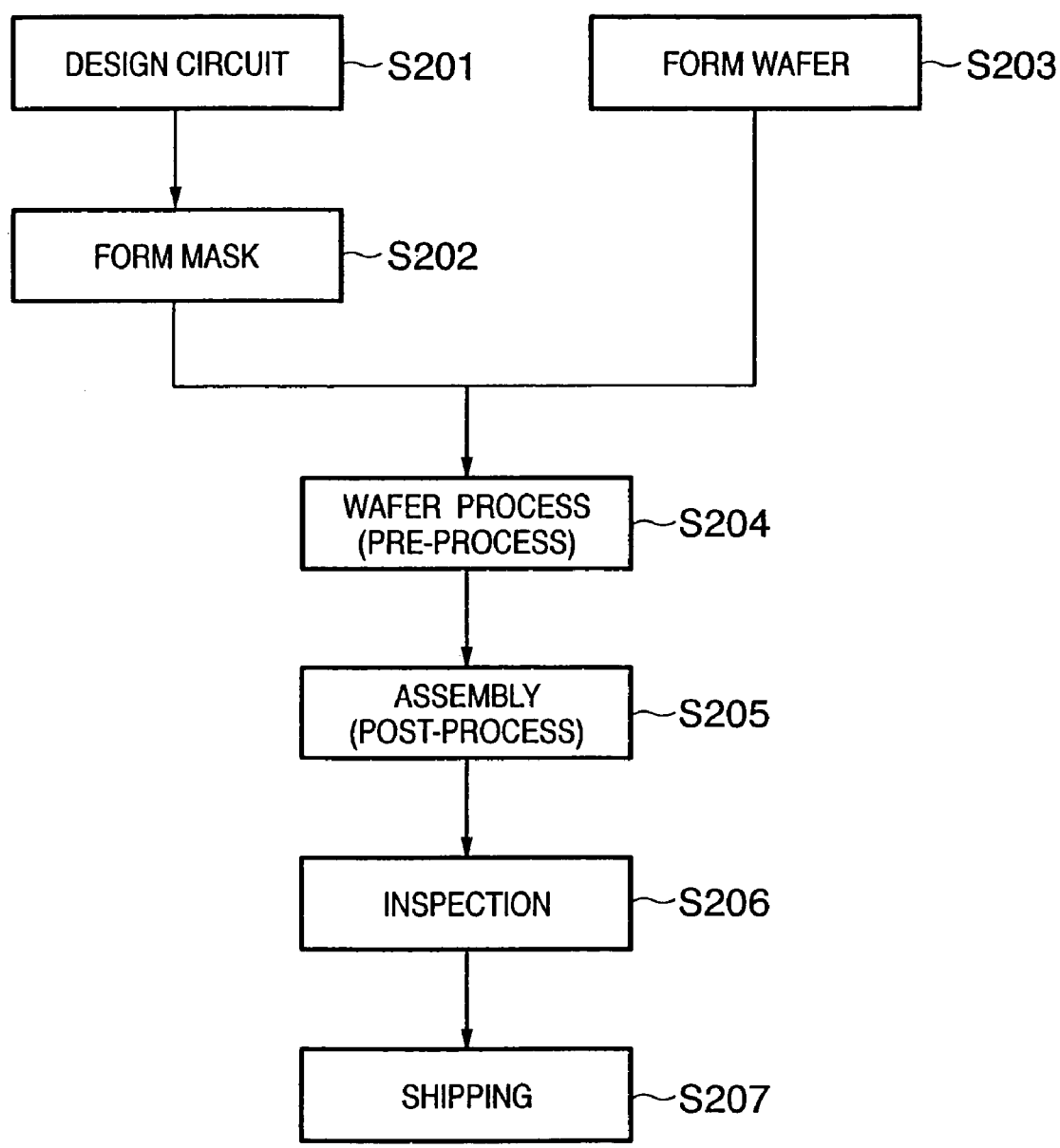
FIG. 13 is a flow chart for explaining the flow of a device manufacturing process.

A semiconductor device manufacturing process using the above-described semiconductor exposure apparatus will be explained. FIG. 13 shows the flow of the whole manufacturing process of a semiconductor device. In step S201 (circuit design), a semiconductor device circuit is designed. In step S202 (mask formation), a mask having the designed circuit pattern is formed. In step S203 (wafer formation), a wafer is formed using a material such as silicon. In step S204 (wafer process), called a pre-process, an actual circuit is formed on the wafer by lithography using the prepared mask and wafer. Step S205 (assembly), called a post-process, is the step of forming a semiconductor chip by using the wafer formed in step S204, and includes an assembly process (dicing and bonding) and a packaging process (chip encapsulation). In step S206 (inspection), the semiconductor device manufactured in step S205 undergoes inspections such as an operation confirmation test and a durability test. After these steps, the semiconductor device is completed and shipped (step S207). For example, the pre-process and post-process are performed in separate dedicated factories, and each of the factories receives maintenance by a remote maintenance system. Information for production management and apparatus maintenance is communicated between the pre-process factory and the post-process factory via the Internet or dedicated network.

Figure 14:
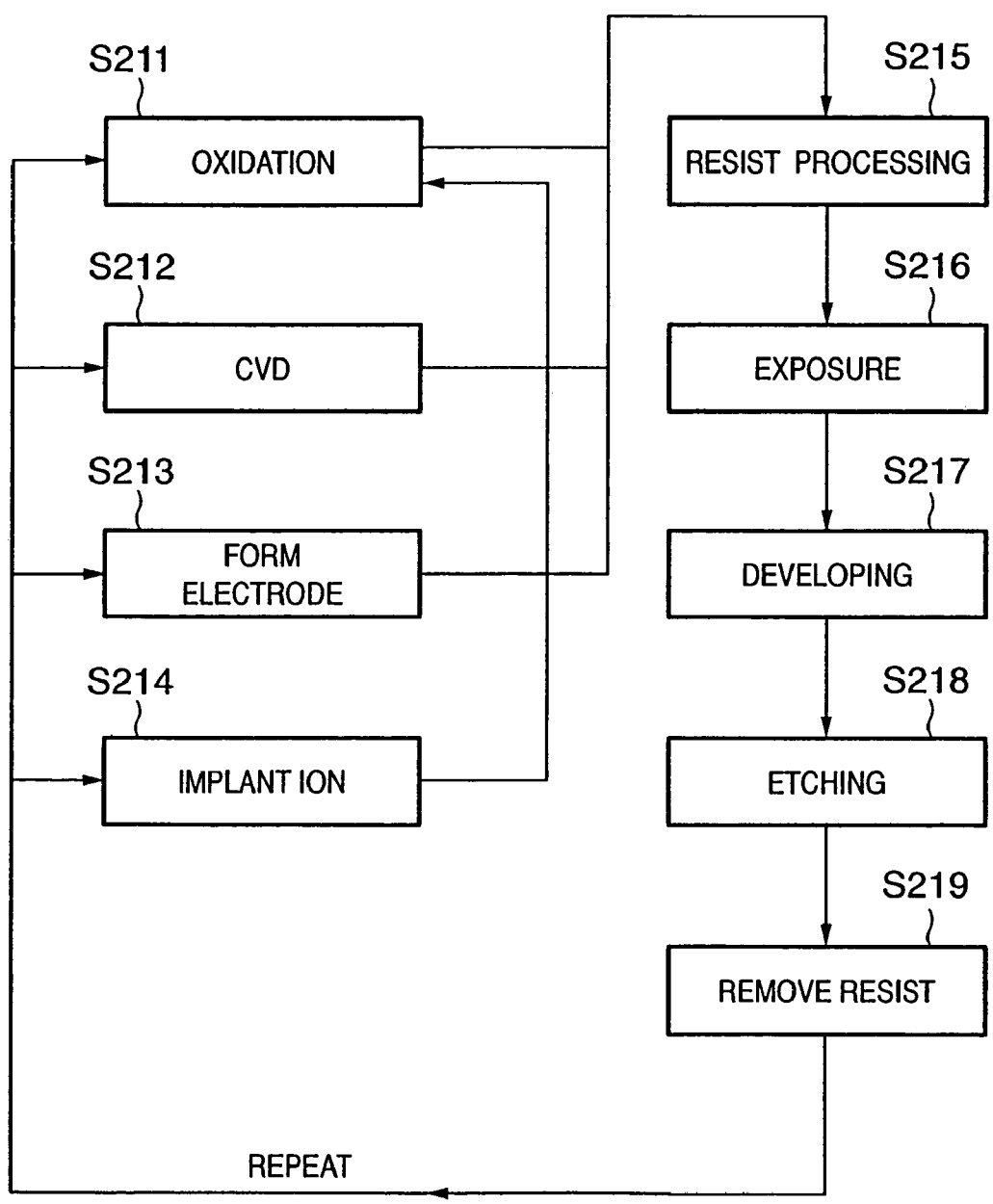
FIG. 14 is a flow chart for explaining a wafer process.

FIG. 14 shows the detailed flow of the wafer process. In step S211 (oxidation), the wafer surface is oxidized. In step S212 (CVD), an insulating film is formed on the wafer surface. In step S213 (electrode formation), an electrode is formed on the wafer by vapor deposition. In step S214 (ion implantation), ions are implanted in the wafer. In step S215 (resist processing), a photosensitive agent is applied to the wafer. In step S16 (exposure), the above-mentioned exposure apparatus exposes the wafer to the circuit pattern of a mask, and prints the circuit pattern on the wafer. In step S217 (developing), the exposed wafer is developed. In step S218 (etching), the resist is etched except for the developed resist image. In step S219 (resist removal), any unnecessary resist after etching is removed. These steps are repeated to form multiple circuit patterns on the wafer. The exposure apparatus used in this process is optimized by the above-described management system. Even if a change over time occurs, the exposure apparatus can be optimized without stopping volume production, increasing the semiconductor device productivity in comparison with the prior art.

As has been described above, the present invention can optimize, during volume production, a parameter value used in global alignment of an exposure apparatus.

As many apparently widely different embodiments of the present invention can be made without departing from the spirit and scope thereof, it is to be understood that the invention is not limited to the specific embodiments thereof except as defined in the claims.

What is claimed is:

1. A processing method for obtaining a condition of an alignment measurement by an exposure apparatus for exposing a substrate to light, said method comprising steps of:

acquiring first data of a difference between a calculated position of an alignment mark of a sampled area on the substrate calculated based on a plurality of measured positions of a plurality of alignment marks of a plurality of sampled areas on the substrate and a measured position of the alignment mark with respect to each of the plurality of sampled areas, the difference being obtained by the exposure apparatus;

acquiring second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus;

a first calculation of calculating a measurement error of the measured position based on the first and second data with respect to each of the plurality of sampled areas; and a second calculation of calculating an offset to be used for the measured position as the condition of the alignment measurement based on a plurality of measurement errors obtained over a plurality of substrates through said first calculation step with respect to each of the plurality of sampled areas.

2. A method according to claim 1, wherein said first calculation step calculates the measurement error by adding the first and second data.

3. A method according to claim 1, wherein said second calculation step calculates the offset by averaging the plurality of measurement errors over the plurality of substrates.

4. A method of manufacturing a device, comprising steps of:

exposing a substrate to light using an exposure apparatus of which a condition of an alignment measurement is obtained through a processing method as defined in claim 1;

developing the exposed substrate; and processing the developed substrate to manufacture the device.

5. A processing method for obtaining a condition of an alignment measurement by an exposure apparatus for exposing a substrate to light, said method comprising steps of:

acquiring first data of a difference between a calculated position of an alignment mark of a sampled area on the substrate calculated based on a plurality of measured positions of a plurality of alignment marks of a plurality of sampled areas on the substrate and the measured position of the alignment mark with respect to each of the plurality of sampled areas, the difference being obtained by the exposure apparatus;

acquiring second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus;

estimating an alignment error to be obtained with respect to each of a plurality of subsets of the plurality of sampled areas based on the first and second data; and selecting, as the condition of the alignment measurement, a subset to be used for the alignment measurement from the plurality of subsets based on a plurality of alignment errors estimated in said estimating step.

6. A method according to claim 5, wherein said estimating step calculates a coefficient for approximately obtaining the measured position of the alignment mark from a position designed for the alignment mark based on the first data with respect to each of the plurality of subsets, and estimates the alignment error based on the coefficient and the second data with respect to each of the plurality of subsets.

7. A method according to claim 5, wherein said selecting step calculates a standard deviation of the plurality of estimated alignment errors with respect to each of the plurality of subsets, and selects the subset to be used for the alignment measurement based on a plurality of calculated standard deviations.

8. A method of manufacturing a device, comprising steps of:
exposing a substrate to light using an exposure apparatus of which a condition of an alignment measurement is obtained through a processing method as defined in claim 5;
developing the exposed substrate; and
processing the developed substrate to manufacture the device.

9. A processing apparatus for obtaining a condition of an alignment measurement by an exposure apparatus for exposing a substrate to light, said apparatus comprising:
a storage configured to store first data of a difference between a calculated position of an alignment mark of a sampled area on the substrate calculated based on a plurality of measured positions of a plurality of the alignment marks of a plurality of the sampled areas on the substrate and the measured position of the alignment mark with respect to each of the plurality of sampled areas, the difference being obtained by the exposure apparatus, and to store second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus; and
a processor configured to calculate a measurement error of the measured position based on the first and second data with respect to each of the plurality of sampled areas, and to calculate an offset to be used for the measured position as the condition of the alignment measurement based on a plurality of calculated measurement errors obtained over a plurality of substrates with respect to each of the plurality of sampled areas.

10. An apparatus according to claim 9, wherein said processor is configured to calculate the measurement error by adding the first and second data.

11. An apparatus according to claim 9, wherein said processor is configured to calculate the offset by averaging the plurality of measurement errors over the plurality of substrates.

12. A processing apparatus for obtaining a condition of an alignment measurement by an exposure apparatus for exposing a substrate to light, said apparatus comprising:
a storage configured to store first data of a difference between a calculated position of an alignment mark of a sampled area on the substrate calculated based on a plurality of measured positions of a plurality of alignment marks of a plurality of sampled areas on the substrate and the measured position of the alignment mark with respect to each of the plurality of sampled areas, the difference being obtained by the exposure apparatus, and to store second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus; and
a processor configured to estimate an alignment error to be obtained with respect to each of a plurality of subsets of the plurality of sampled areas based on the first and second data, and to select, as the condition of the alignment measurement, a subset to be used for the alignment measurement from the plurality of subsets based on the estimated alignment errors.

13. An apparatus according to claim 12, wherein said processor is configured to calculate a coefficient for approximately obtaining the measured position of the alignment mark from a position designed for the alignment mark based on the first data with respect to each of the plurality of subsets, and to estimate the alignment error based on the coefficient and the second data with respect to each of the plurality of subsets.

14. An apparatus according to claim 12, wherein said processor is configured to calculate a standard deviation of the estimated alignment errors with respect to each of the plurality of subsets, and to select the subset to be used for the alignment measurement based on the calculated standard deviations.

15. A program for causing a computer to execute a processing method for obtaining a condition of an alignment measurement by an exposure apparatus for exposing a substrate to light, said method comprising steps of:
acquiring first data of a difference between a calculated position of an alignment mark of a sampled area on the substrate calculated based on a plurality of measured positions of a plurality of alignment marks of a plurality of the sampled areas on the substrate and the measured position of the alignment mark with respect to each of the plurality of sampled areas, the difference being obtained by the exposure apparatus;
acquiring second data of an overlay error of a pattern on the substrate with respect to each of the plurality of sampled areas, the pattern formed by exposing the substrate to the light based on the calculated positions of the plurality of alignment marks by the exposure apparatus, the overlay error being obtained by an overlay inspection apparatus;
a first calculation of calculating a measurement error of the measured position based on the first and second data with respect to each of the plurality of sampled areas; and
a second calculation of calculating an offset to be used for the measured position as the condition of the alignment measurement based on a plurality of measurement errors obtained over a plurality of substrates through said first calculation step with respect to each of the plurality of sampled areas.

16. A program for causing a computer to execute a processing method for obtaining a condition of an alignment measurement by an exposure apparatus for exposing a substrate to light, said method comprising steps of:
acquiring first data of a difference between a calculated position of an alignment mark of a sampled area on the substrate calculated based on a plurality of measured positions of a plurality of alignment marks of a plurality of sampled areas on the substrate and the measured position of the alignment mark with respect to each of the plurality of sampled areas, the difference being obtained by the exposure apparatus;
acquiring second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus;

estimating an alignment error to be obtained with respect to each of a plurality of subsets of the plurality of sampled areas based on the first and second data; and selecting, as the condition of the alignment measurement, a subset to be used for the alignment measurement from the plurality of subsets based on a plurality of alignment errors estimated in said estimating step.

17. A processing method for obtaining a condition of an alignment measurement by an exposure apparatus for exposing a substrate to light, said method comprising steps of:

acquiring first data of a difference between a calculated position of an alignment mark of a sampled area on the substrate calculated based on a plurality of measured positions of a plurality of alignment marks of a plurality of sampled areas on the substrate and the measured position of the alignment mark with respect to each of the plurality of sampled areas, the difference being obtained by the exposure apparatus;

acquiring second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus; and obtaining the condition of the alignment measurement based on the first and second data.

18. A method of manufacturing a device, comprising steps of:

exposing a substrate to light using an exposure apparatus of which a condition of an alignment measurement is obtained through a processing method as defined in claim 17;

developing the exposed substrate; and processing the developed substrate to manufacture the device.

19. A processing apparatus for obtaining a condition of an alignment measurement by an exposure apparatus for exposing a substrate to light, said apparatus comprising:

a storage configured to store first data of a difference between a calculated position of an alignment mark of a sampled area on the substrate calculated based on a plurality of measured positions of a plurality of alignment marks of a plurality of sampled areas on the substrate and the measured position of the alignment mark with respect to each of the plurality of sampled areas, the difference being obtained by the exposure apparatus, and to store second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus; and a processor configured to obtain the condition of the alignment measurement based on the first and second data.

20. A program for causing a computer to execute a processing method for obtaining a condition of an alignment measurement by an exposure apparatus for exposing a substrate to light, said method comprising steps of:

acquiring first data of a difference between a calculated position of an alignment mark of a sampled area on the substrate calculated based on a plurality of measured positions of a plurality of alignment marks of a plurality of sampled areas on the substrate and the measured position of the alignment mark with respect to each of the plurality of sampled areas, the difference being obtained by the exposure apparatus;

acquiring second data of an overlay error of a pattern on the substrate with respect to each of the plurality of sampled areas, the pattern being formed by exposing the substrate to the light based on the calculated positions of the plurality of alignment marks by the exposure apparatus, the overlay error being obtained by an overlay inspection apparatus; and obtaining the condition of the alignment measurement based on the first and second data.

* * * * *

UNITED STATES PATENT AND TRADEMARK OFFICE
CERTIFICATE OF CORRECTION

PATENT NO. : 7,385,700 B2 Page 1 of 1
APPLICATION NO. : 11/218538
DATED : June 10, 2008
INVENTOR(S) : Takahiro Matsumoto et al.

It is certified that error appears in the above-identified patent and that said Letters Patent is hereby corrected as shown below:

COLUMN 10:
Line 4, "afer" should read -- wafer --.

Lines 56-57, " $A'_i = \begin{pmatrix} x_i - xo_i \\ y_i - yo \end{pmatrix}$ " should read -- $A'_i = \begin{pmatrix} x_i - xo_i \\ y_i - yo_i \end{pmatrix}$ --.

COLUMN 13:
Line 6, "θy$_j$}:" should read -- θy$_j$) -- and "number)" should read -- number} --.

Signed and Sealed this

Eleventh Day of November, 2008

JON W. DUDAS
*Director of the United States Patent and Trademark Office*